(12) United States Patent
Yeh et al.

(10) Patent No.: US 10,797,015 B2
(45) Date of Patent: Oct. 6, 2020

(54) METHOD OF MANUFACTURING 3DIC STRUCTURE

(71) Applicant: Taiwan Semiconductor Manufacturing Co., Ltd., Hsinchu (TW)

(72) Inventors: Sung-Feng Yeh, Taipei (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/576,786

(22) Filed: Sep. 20, 2019

(65) Prior Publication Data

US 2020/0013746 A1 Jan. 9, 2020

Related U.S. Application Data

(62) Division of application No. 15/983,064, filed on May 17, 2018, now Pat. No. 10,475,762.

(51) Int. Cl.
| | |
|---|---|
| *H01L 21/768* | (2006.01) |
| *H01L 21/306* | (2006.01) |
| *H01L 23/00* | (2006.01) |
| *H01L 21/3105* | (2006.01) |
| *H01L 23/31* | (2006.01) |
| *H01L 23/48* | (2006.01) |
| *H01L 25/00* | (2006.01) |
| *H01L 21/56* | (2006.01) |

(52) U.S. Cl.
CPC ........ *H01L 24/33* (2013.01); *H01L 21/30625* (2013.01); *H01L 21/31053* (2013.01); *H01L 21/561* (2013.01); *H01L 21/76898* (2013.01); *H01L 23/3128* (2013.01); *H01L 23/3135* (2013.01); *H01L 23/481* (2013.01); *H01L 24/05* (2013.01); *H01L 24/32* (2013.01); *H01L 25/50* (2013.01); *H01L 24/13* (2013.01); *H01L 2224/02331* (2013.01); *H01L 2224/02372* (2013.01); *H01L 2224/0401* (2013.01); *H01L 2224/05569* (2013.01); *H01L 2224/13024* (2013.01); *H01L 2224/32057* (2013.01); *H01L 2224/32221* (2013.01); *H01L 2224/33051* (2013.01)

(58) Field of Classification Search
CPC ............... H01L 25/0652; H01L 22/32; H01L 23/49827; H01L 23/5226
USPC ........................................... 257/782
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |

(Continued)

*Primary Examiner* — Elias Ullah
(74) *Attorney, Agent, or Firm* — JCIPRNET

(57) ABSTRACT

A method of manufacturing a 3DIC structure includes the following processes. A die is bonded to a wafer. A first dielectric layer is formed on the wafer and laterally aside the die. A second dielectric material layer is formed on the die and the first dielectric layer. A portion of the second dielectric material layer over a non-edge region of the wafer is selectively removed to form a protruding portion over an edge region of the wafer. The second dielectric material layer is planarized to form a second dielectric layer on the first dielectric layer and the die. A bonding film is formed on the second dielectric layer. A carrier is bonded to the wafer through the bonding film.

20 Claims, 31 Drawing Sheets

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |

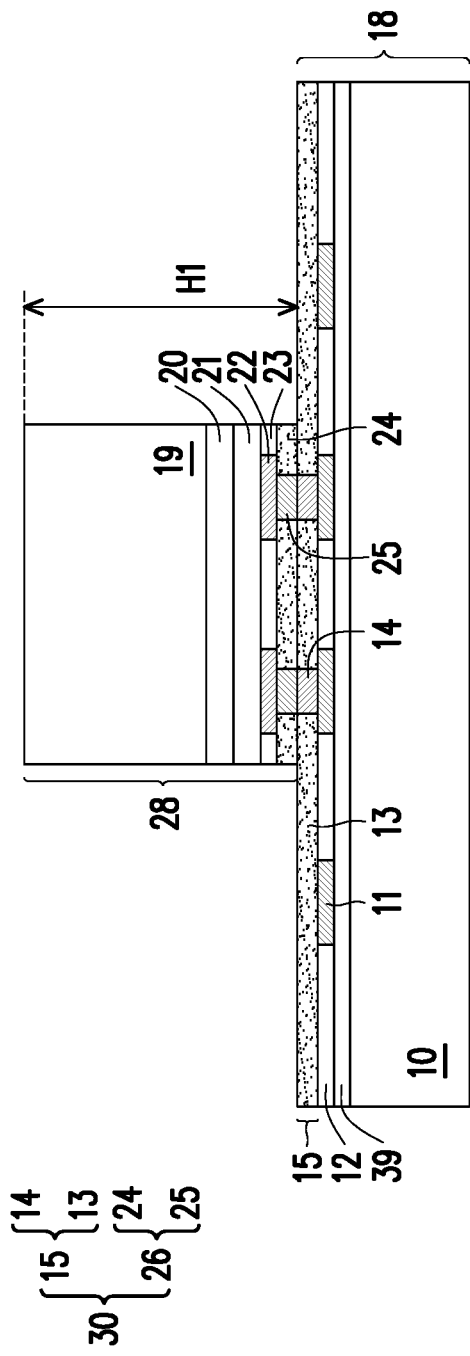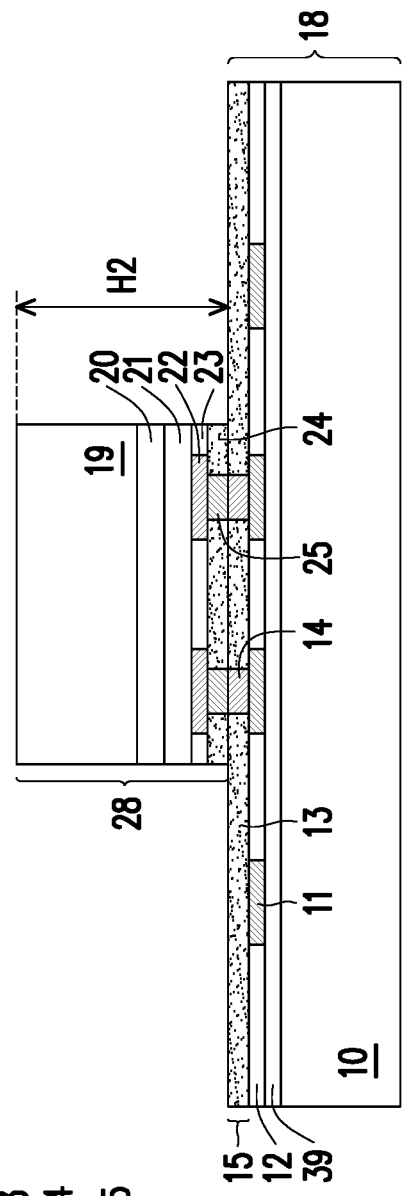

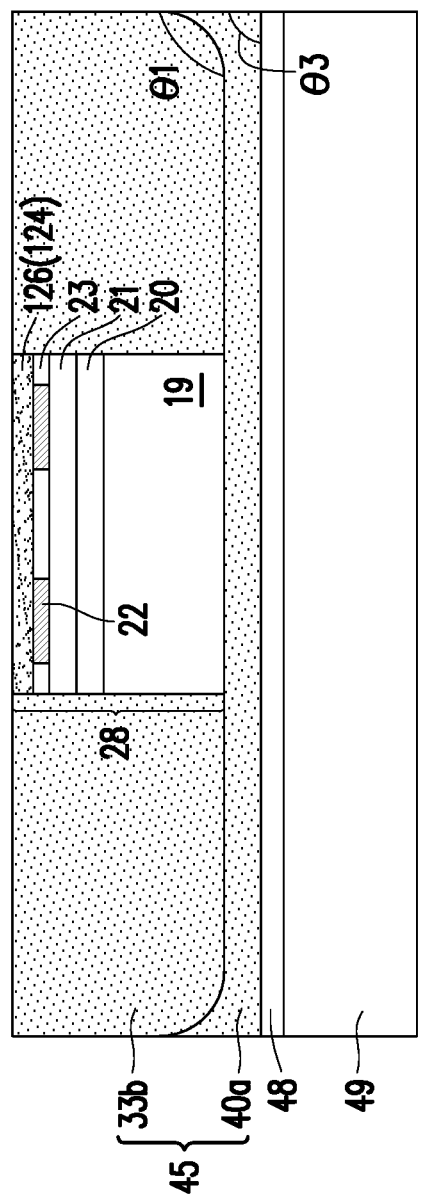

METHOD OF MANUFACTURING 3DIC STRUCTURE

CROSS-REFERENCE TO RELATED APPLICATION

This application is a divisional application of and claims the priority benefit of a prior application Ser. No. 15/983,064, filed on May 17, 2018. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

FIG. 8A to FIG. 8C are schematic cross-sectional views illustrating a method of forming a 3DIC structure according to some embodiments of the disclosure.

DETAILED DESCRIPTION

Figure 1A:
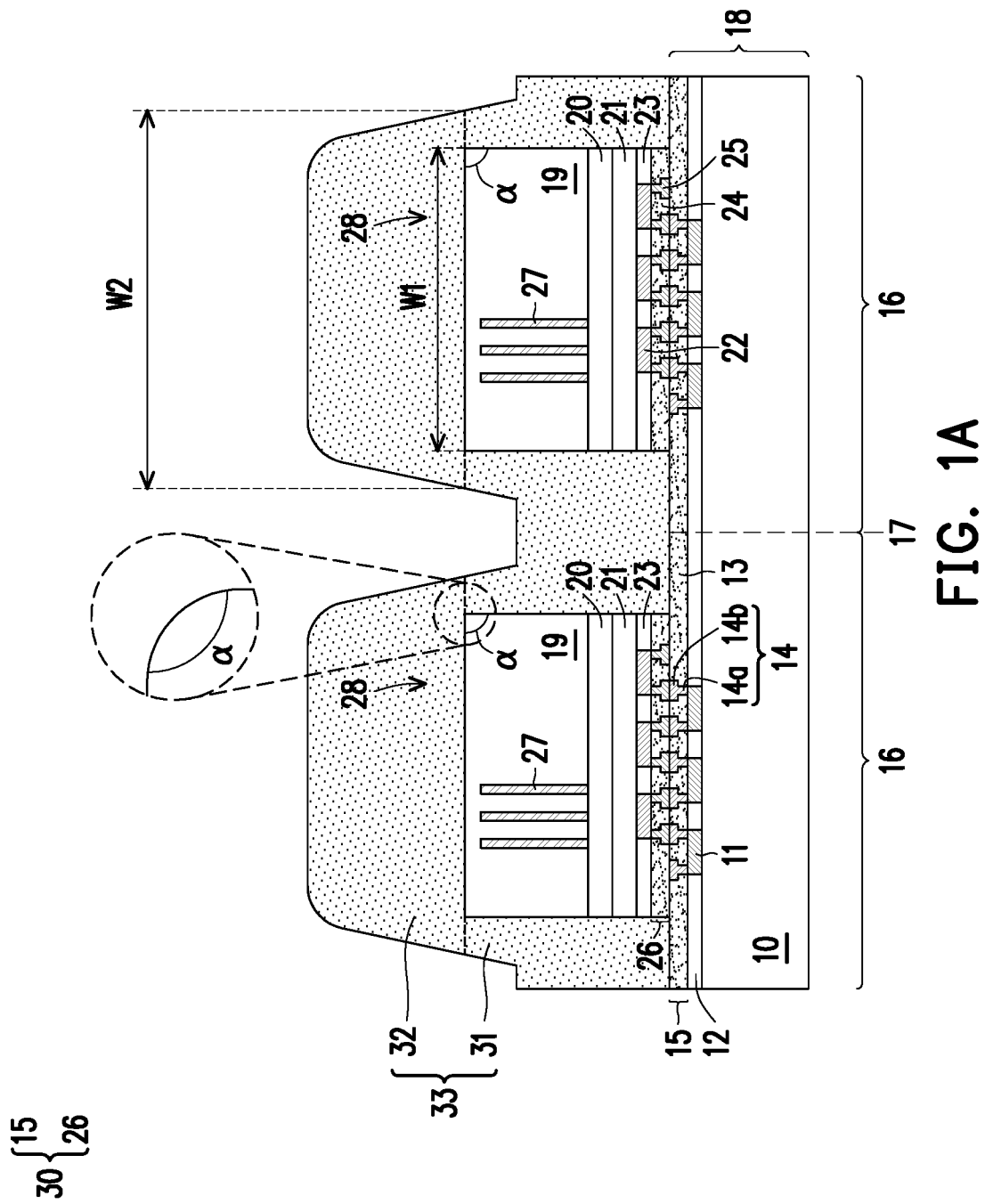
FIG. 1A to FIG. 1E are schematic cross-sectional views illustrating a method of forming a 3DIC structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views illustrating a method of forming a 3DIC structure according to a first embodiment of the disclosure. FIG. 2 is schematic cross-sectional view illustrating a 3DIC structure according to some embodiments of the disclosure.

Figure 2:
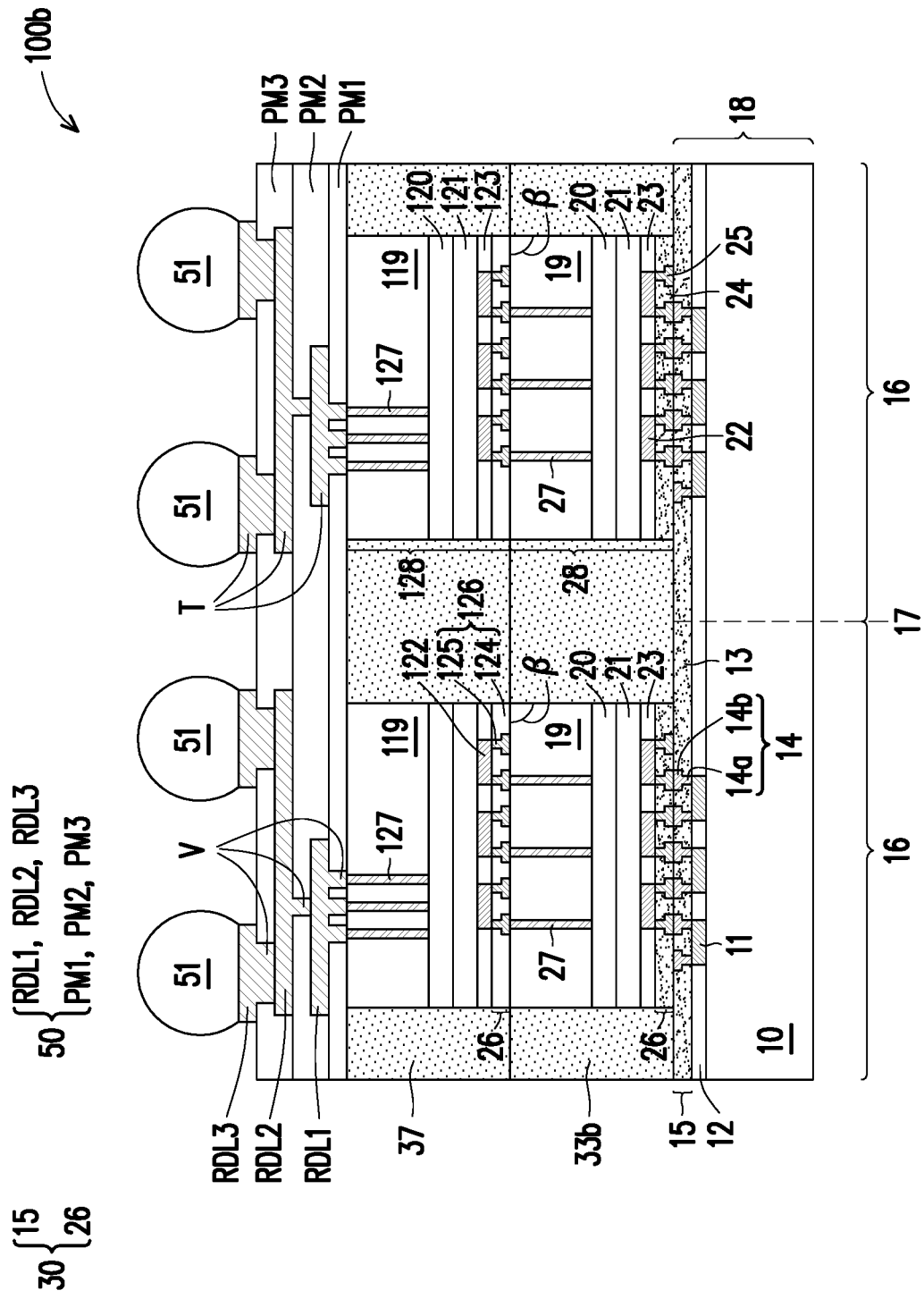
FIG. 2 is schematic cross-sectional view illustrating a 3DIC structure according to some embodiments of the disclosure.

Referring to FIG. 1A, a wafer 18 including a plurality of dies 16 is provided. The dies 16 may respectively be an application-specific integrated circuit (ASIC) chip, an analog chip, a sensor chip, a wireless and radio frequency chip, a voltage regulator chip or a memory chips, for example. The dies 16 may be the same types of dies or the different types of dies. The number of the dies formed in the wafer 18 shown in FIG. 1A is merely for illustration, and the disclosure is not limited thereto. In some embodiments, the wafer 18 includes a plurality of dies arranged in an array, and the number of the dies may be adjusted according to the design of products. In some embodiments, the dies 16 may be separated along scribe lines 17 by a die-saw process in subsequent processes.

In some embodiments, the wafer 18 includes a substrate 10, a plurality of pads 11, a dielectric layer 12 and a bonding structure 15. The substrate 10 is a semiconductor substrate such as a silicon substrate. The substrate 10 is, for example, a bulk silicon substrate, a doped silicon substrate, an undoped silicon substrate, or a silicon-on-insulator (SOI) substrate. The dopant of the doped silicon substrate may be an N-type dopant (such as phosphorus or arsenic), a P-type dopant (such as boron) or a combination thereof. The substrate 10 may also be formed by the other semiconductor materials. The other semiconductor materials include but are not limited to silicon germanium, silicon carbide, gallium arsenide, or the like. The substrate 10 includes active areas and isolation structures (not shown).

In some embodiments, the wafer 18 includes a plurality of devices (not shown) formed on the substrate 10. The devices include active components, passive components, or a combination thereof. In some embodiments, the devices include integrated circuit devices, for example. In some embodiments, the devices are, for example, transistors, capacitors, resistors, diodes, photodiodes, fuse devices, or other similar devices. However, the disclosure is not limited thereto. In some other embodiments, the wafer 18 may be a blank wafer without devices.

The pad 11 may be a part of an interconnect structure (not shown) and electrically connected to the devices (not shown) formed on the substrate 10. The pads 11 may be a top metal layer of the interconnect structure or a conductive pad electrically connected to the top metal layer of the interconnect structure. The pad 11 may include tungsten (W), copper (Cu), aluminum (Al), alloys thereof, or a combination thereof.

The dielectric layer 12 is formed laterally aside the pads 11, covering sidewalls of the pads 11 and exposing top surfaces of the pads 11. The dielectric layer 12 may include silicon oxide, silicon nitride, silicon oxynitride, or a combination thereof. In some embodiments, the top surface of dielectric layer 12 and the top surface of the pads 11 are substantially coplanar with each other.

In some embodiments, the bonding structure 15 is formed on the pads 11 and the dielectric layer 12. The bonding structure 15 may include dielectric material, conductive material, or a combination thereof. In some embodiments, the bonding structure 15 includes a dielectric layer 13 and a plurality of conductive features 14. The conductive feature 14 may be conductive layer, conductive bump, conductive pillar, or the like. The dielectric layer 13 covers the top surface of the dielectric layer 12 and a portion of the top surface of the pads 11. The dielectric layer 13 may include a single-layer structure or a multilayer structure. The dielectric layer 13 includes oxide such as silicon oxide, nitride such as silicon nitride, oxynitride such as silicon oxynitride, undoped silicate glass (USG), tetraethyl orthosilicate (TEOS), or a combination thereof. The material of the dielectric layer 13 may be the same as or different from the material of the dielectric layer 12. The dielectric layer 13 may be formed by a suitable process such as spin coating, chemical vapor deposition (CVD) or the like.

The conductive feature 14 is formed in and penetrates through the dielectric layer 13 to be electrically connected to the pads 11. In some embodiments, the top surface of the conductive feature 14 is substantially coplanar with the top surface of the dielectric layer 13. The conductive feature 14 may be formed of aluminum, copper, nickel, gold, silver, tungsten, TiN, or a combination thereof and formed by electro-chemical plating process, CVD, physical vapor deposition (PVD) or the like. The cross-section shape of the conductive feature 14 may be square, rectangle, trapezoid, T-shaped, or the like. In some embodiments, the conductive feature 14 is a via formed in the dielectric layer 13. In some embodiments, the conductive feature 14 is T-shaped and includes a second via 14$b$ on a first via 14$a$. The second via 14$b$ has a larger size than that of the first via 14$a$. The width of the second via 14$b$ is larger than the width of the first via 14$a$.

A plurality of dies 28 are bonded to the wafer 18 through a bonding process. In some embodiments, the dies 28 are respectively bonded to the dies 16 and are spaced from each other. The dies 28 and the dies 16 may be the same types of dies or the different types of dies.

In some embodiments, the dies 28 are dies cut from a same wafer or a plurality of wafers by die-saw processes. That is, the dies 28 may be cut from a same wafer or different wafers. In some embodiments, the number of the dies bonded to the wafer 18 is the same as the number of the dies included in the wafer 18, but the disclosure is not limited thereto. The sizes, the structures and the types of the dies 28 may be the same as or different from each other.

In some embodiments, the die 28 respectively includes a substrate 19, a device layer 20, an interconnect structure 21, a plurality of pads 22, a dielectric layer 23 and a bonding structure 26. The substrate 19 is, for example, a bulk silicon substrate, a doped silicon substrate, an undoped silicon substrate, or a SOI substrate. The dopant of the doped silicon substrate may be an N-type dopant (such as phosphorus or arsenic), a P-type dopant (such as boron) or a combination thereof. The substrate 19 may also be formed by the other semiconductor materials. The other semiconductor materials include but are not limited to silicon germanium, silicon carbide, gallium arsenide, or the like. The material of substrate 19 may be similar to, the same as or different from that of the substrate 10.

The device layer 20 includes a wide variety of devices (not shown) formed on active areas of the substrate 19. In some embodiments, the devices include active components, passive components, or a combination thereof. In some embodiments, the devices include integrated circuit devices, for example. In some embodiments, the devices are, for example, transistors, capacitors, resistors, diodes, photodiodes, fuse devices, or other similar devices.

The interconnect structure 21 is formed over the substrate 19 and the device layer 20. In some embodiments, the interconnect structure 21 includes one or more dielectric layers and conductive structures formed therein (not shown). The conductive structures include multiple layers of contacts, conductive lines and vias, and are electrically connected to the devices in the device layer 21.

In some embodiments, one or more through-silicon vias (TSVs) 27 are formed in the substrate 10 and are electrically connected to the interconnect structure 21 and the devices in the device layer 20. In some embodiments, the TSV 27 includes a conductive via and a liner (not shown) surrounding the surface of the conductive via. The conductive via may include copper, copper alloys, aluminum, aluminum alloys, Ta, TaN, Ti, TiN, CoW or combinations thereof. The liner may include dielectric material, such as silicon oxide. In some embodiments, the TSV 27 does not penetrate through the substrate 10, and the top surface of the TSV 9 is still covered by the substrate 19. In subsequent processes, the substrate 19 may be thinned by a grinding or planarization process, so as to expose the top surface of the TSV 27, and the TSV 27 may be connected to other components.

The pads 22 are formed on the interconnect structure 21. The pads 22 are electrically connected to the conductive structure in the interconnect structure 21 to provide an external connection of the devices in the device layer 20. The material of the pad 22 may be the same as or different from that of the pad 11 of the wafer 18. In some embodiments, the pad 22 may include metal or metal alloy, such as aluminum, copper, nickel, or alloys thereof.

The dielectric layer 23 is formed over the interconnect structure 21 and aside the pads 22 to cover the sidewalls of the pads 22. The material and the structural feature of the dielectric layer 23 are similar to, the same as or different from those of the dielectric layer 12 of the wafer 18, which are not described again.

The bonding structure 26 is formed on the dielectric layer 23 and the pads 22. In some embodiments, the bonding structure 26 includes a dielectric layer 24 and a plurality of conductive feature 25 in the dielectric layer 24. The materials and the structures of the dielectric layer 24 and the conductive features 25 are similar to, the same as or different from those of the dielectric layer 13 and the conductive features 14, respectively.

In some embodiments, the dies 28 are bonded to the wafer 18 through a hybrid bonding process. The hybrid bonding involves at least two types of bonding, including metal-to-metal bonding and non-metal-to-non-metal bonding such as dielectric-to-dielectric bonding. That is to say, the conductive features 14 and the conductive features 25 are bonded by metal-to-metal bonding, the dielectric layer 13 and the dielectric layer 24 are bonded by dielectric-to-dielectric bonding. In other words, the bonding structure 26 is bonded to the bonding structure 15, the bonding structure 26 and the bonding structure 15 together form a bonding structure 30 connecting the dies 28 to the wafer 18. In some embodiments, the bonding structure 30 is a hybrid-bonding structure. However, the disclosure is not limited thereto. In some other embodiments, the dies 28 may be bonded to the wafer 18 through a fusion bonding structure or micro bumps.

Still referring to FIG. 1A, in some embodiments, a thinning process may be performed on the dies 28, such that the dies 28 are thinned. The thinning process includes a grinding process, a polishing process or a CMP process, or a combination thereof. In some embodiments, as shown in the enlarged view, the corner α of the die 28 is slightly damaged and being rounded due to the thinning process.

Thereafter, a dielectric material layer 33 is formed over the wafer 18 and the dies 28. The dielectric material layer 33 covers the top surface of the wafer 18, the top surfaces and the sidewalls of the dies 28, and fills in the gaps between the dies 28. In some embodiments, the dielectric material layer 33 is also referred as a gap-fill dielectric layer. In some embodiments, the material of the dielectric material layer 33 includes an inorganic dielectric material, an organic dielectric material, or a combination thereof. The inorganic dielectric material includes oxide such as silicon oxide, nitride such as silicon nitride, oxynitride such as silicon oxynitride, silicon carbonitride (SiCN), silicon carbon oxide (SiCO), or a combination thereof. The organic dielectric material includes polymer such as polybenzoxazole (PBO), polyimide, benzocyclobutene (BCB), epoxy, a combination thereof, or the like. The forming method of the dielectric material layer 33 includes a deposition process such as chemical vapor deposition (CVD), plasma-enhanced chemical vapor deposition (PECVD), or the like.

In some embodiments, the surface or the topography of the dielectric material layer 33 is undulated. In some embodiments, the topography of the dielectric material layer 33 is similar to or conformal with the dies 28 on the wafer 18. In some embodiments, the dielectric material layer 33 includes a body part 31 and a plurality of protruding parts 32. The body part 31 is located on the wafer 18 and laterally aside the dies 28, covering a portion of the top surface of the wafer 18 and the sidewalls of the dies 28. That is, the body part 31 is located in the gaps between the dies 28. The protruding parts 32 are located over the body part 31 and on the dies 28, so as to cover the top surfaces of the dies 28 and a portion of the top surface of the body part 31. The bottom width W2 of the protruding part 32 is larger than the top width W1 of the die 28. In other words, the corners α of the dies 28 are covered by the dielectric material layer 33.

In some embodiments, the cross-section shape of the protruding part 32 may be square, rectangle, trapezoid, or the like. However, the disclosure is not limited thereto, the cross-section shape of the protruding part 32 may be any other shapes, as long as the top surfaces, the corners and the sidewalls of the dies 28 are covered by the dielectric material layer 33.

Figure 1B:
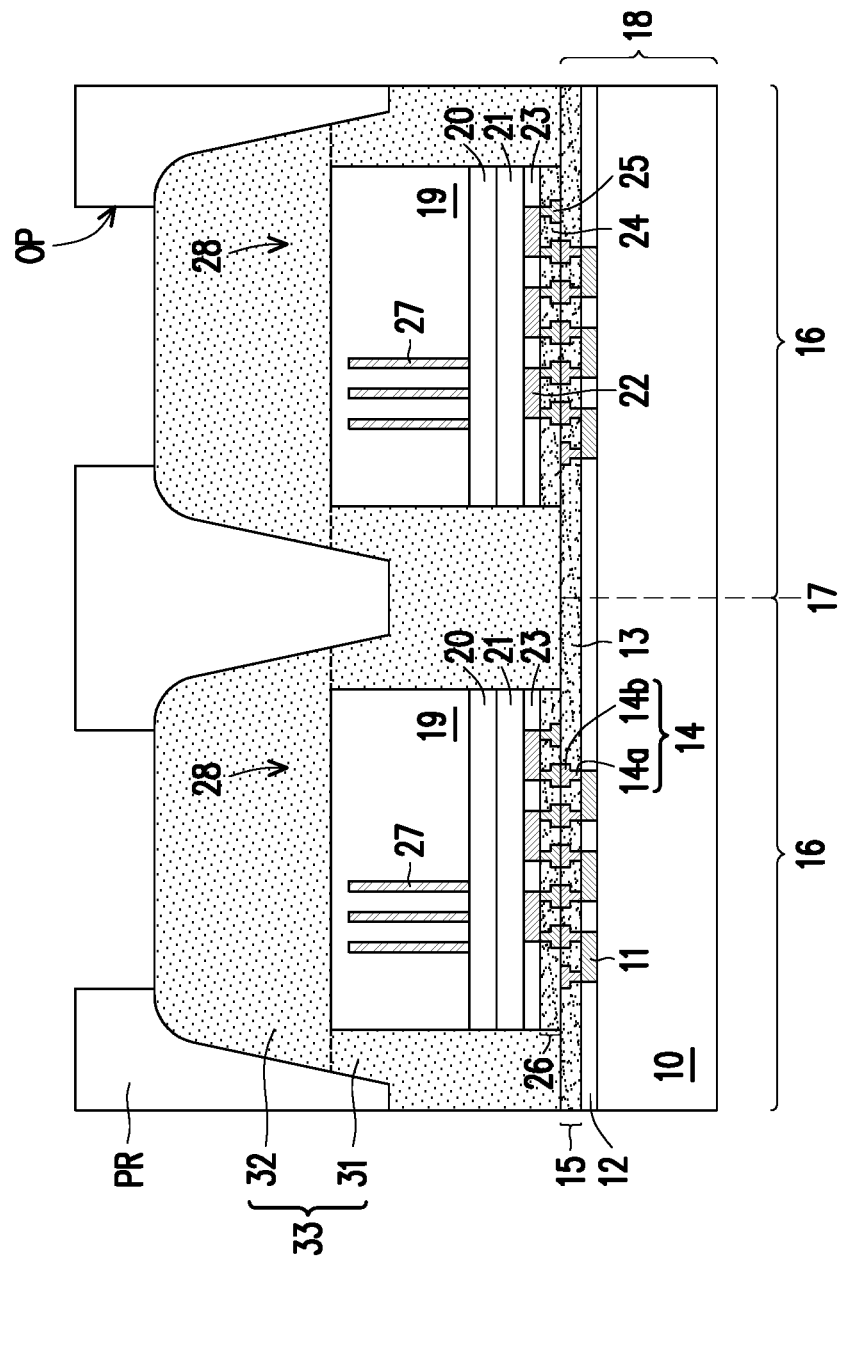

Referring to FIG. 1B, a mask layer PR including a plurality of openings OP1 is formed on the dielectric material layer 33. The mask layer PR is a patterned photoresist, for example. The mask layer PR may be formed by forming a photoresist on the dielectric material layer 33, and exposure and development processes are then performed on the photoresist. The mask layer PR covers the body part 31, the sidewalls and portions of top surfaces of the protruding part 32 of the dielectric material layer 33.

The openings OP of the mask layer PR expose portions of top surfaces of the protruding part 32. The opening OP are located at the corresponding position over the die 28. In some embodiments, the width of the opening OP is less than the top width W1 of the die 28.

Figure 1C:
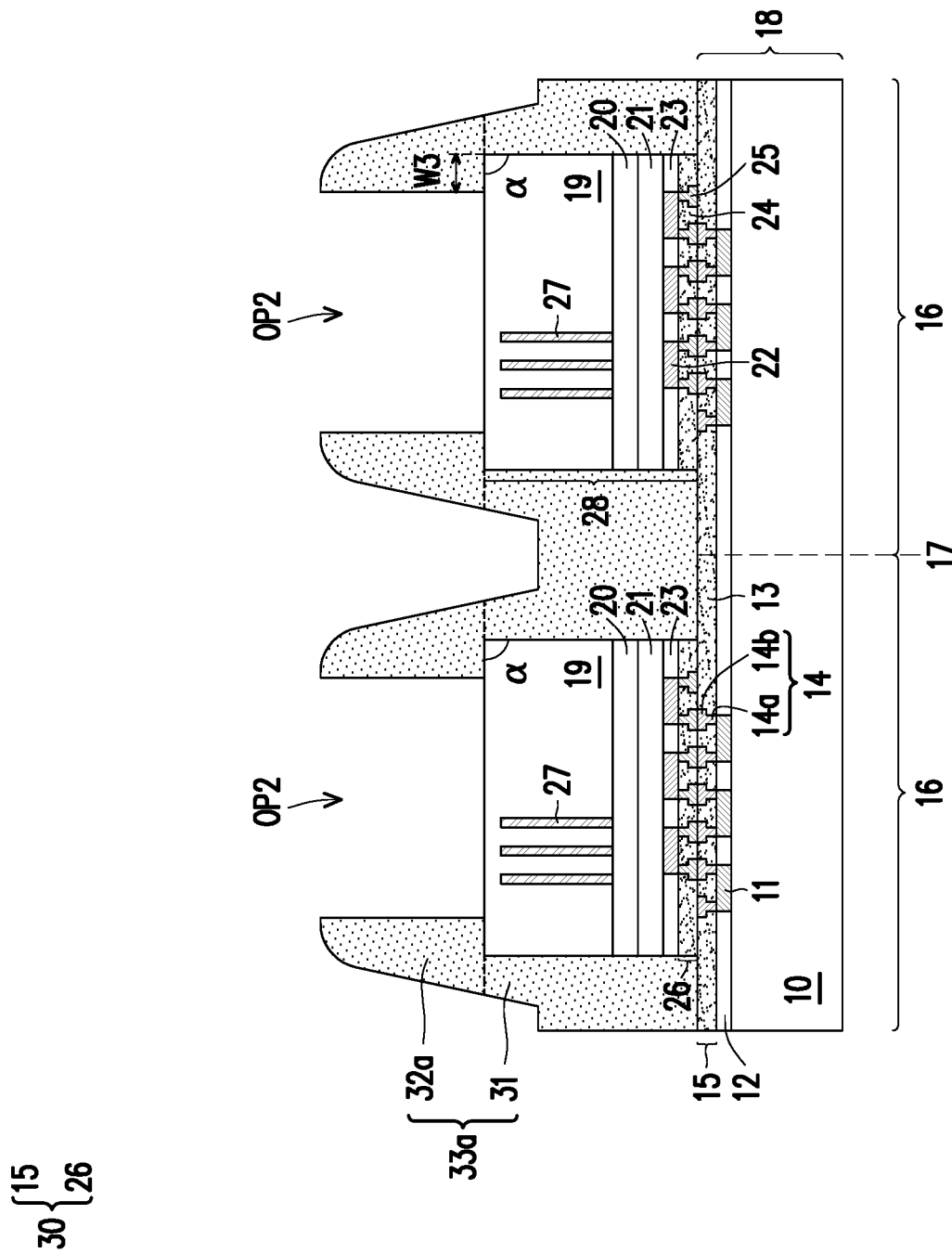

Referring to FIG. 1B and FIG. 1C, a removal process is performed with the mask layer PR as a mask to remove portions of the protruding parts 32 of the dielectric material layer 33 on the dies 28. The removal process is an etching process such as an anisotropic etching process, an isotropic etching process, or a combination thereof. In some embodiments, the etching process includes a wet etching process, a dry etching process, or a combination thereof. Thereafter, the mask layer PR is stripped by an ashing process, for example. After the removal process is performed, a dielectric material layer 33a including a plurality of openings OP2 is formed. In some embodiments, the removal process is stopped until the top surface of the die 28 is exposed, and the openings OP2 expose portions of the top surfaces of the dies 28, but the disclosure is not limited thereto. In some other embodiments, the removal process is stopped before the top surface of the die 28 is exposed, and the opening OP2 does not expose the top surface of the die 28.

Referring to FIG. 1C, the dielectric material layer 33a includes a body part 31 and a plurality of protrusions 32a. The protrusion 32a is on the body part 31 and on the dies 28. The protrusion 32a covers the top surface of the edges of the dies 28, and protrudes laterally with respect to sidewalls of the die 28 in a direction parallel with the top surface of the die 28 to cover a portion of the top surface of the body part 31. In other words, the dielectric material layer 33a covers the sidewalls and top surfaces of the edges of the dies 28. In other words, the corners α of the dies 28 are covered by the dielectric material layer 33a. In some embodiments, the cross-section shape of the protrusion 32a is tooth-shaped, triangle, arc-shaped, sector, or the like, for example. In some embodiments, as shown in FIG. 1C, the inner sidewall of the protrusion 32a is straight, and the outer sidewall of the protrusion 32a is arced or inclined. The inner sidewall of the protrusion 32a is located on the dies 28, and the outer sidewall is located on the body part 31. However, the disclosure is not limited thereto, in some other embodiments, each of the inner sidewall and the outer sidewall of the protrusion 32a may be straight or inclined.

Figure 4A:
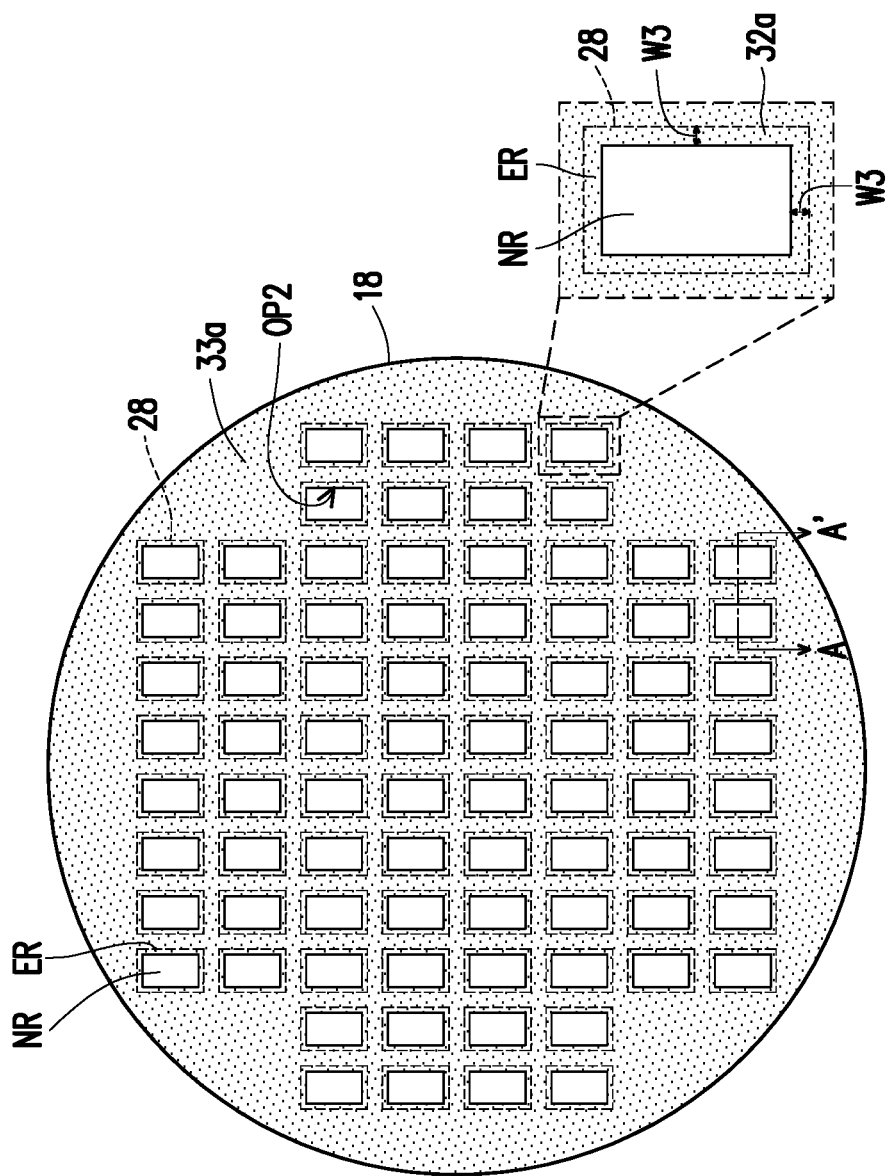
FIGS. 4A to 4C are the top views illustrating a dielectric material layer on dies and wafer according to some embodiments of the disclosure.

FIG. 4A is a top view of the structure shown in FIG. 1C, and FIG. 1C is a cross-sectional view along line A-A' of FIG. 4A.

Referring to FIG. 1C and FIG. 4A, in some embodiments, a plurality of dies 28 are bonded to the wafer 18. The dies 28 are spaced from each other and arranged in an array on the wafer 18. The dielectric material layer 33a is located on the dies 28 and fills into the gap between the dies 28, covering the edges and sidewalls of the dies 28, such that corners α of the dies 28 are covered by the dielectric material layer 33a.

In some embodiments, the top view of the die 28 is square, rectangle, or the like, but the disclosure is not limited thereto. The die 28 includes corners α and includes an edge region ER and a non-edge region NR. The edge region ER is ring-shaped and surrounding the non-edge region NR.

The dielectric material layer 33a covers the edge region ER and the corners α of the die 28, and the opening OP2 of the dielectric material layer 33a expose the non-edge region NR of the die 28. In some embodiments, when viewed in top view, the opening OP2 is located within region of the die 28. That is to say, the opening OP2 is overlapped with the die 28. In some embodiments, the shape of the opening OP2 is similar to, the same as or different from the shape of the die 28, and the area of the opening OP2 is less than the area of the die 28. In some embodiments, the ratio of the area of the opening OP2 to the area of the die 28 ranges from 70% to 90%. In some embodiments, the width W3 of the edge region ER covered by the dielectric material layer 33a ranges from 10 µm to 500 µm. The ratio of the width W3 of the edge region ER to the top width W1 of the die 28 range from 10% to 30%.

Figure 1D:
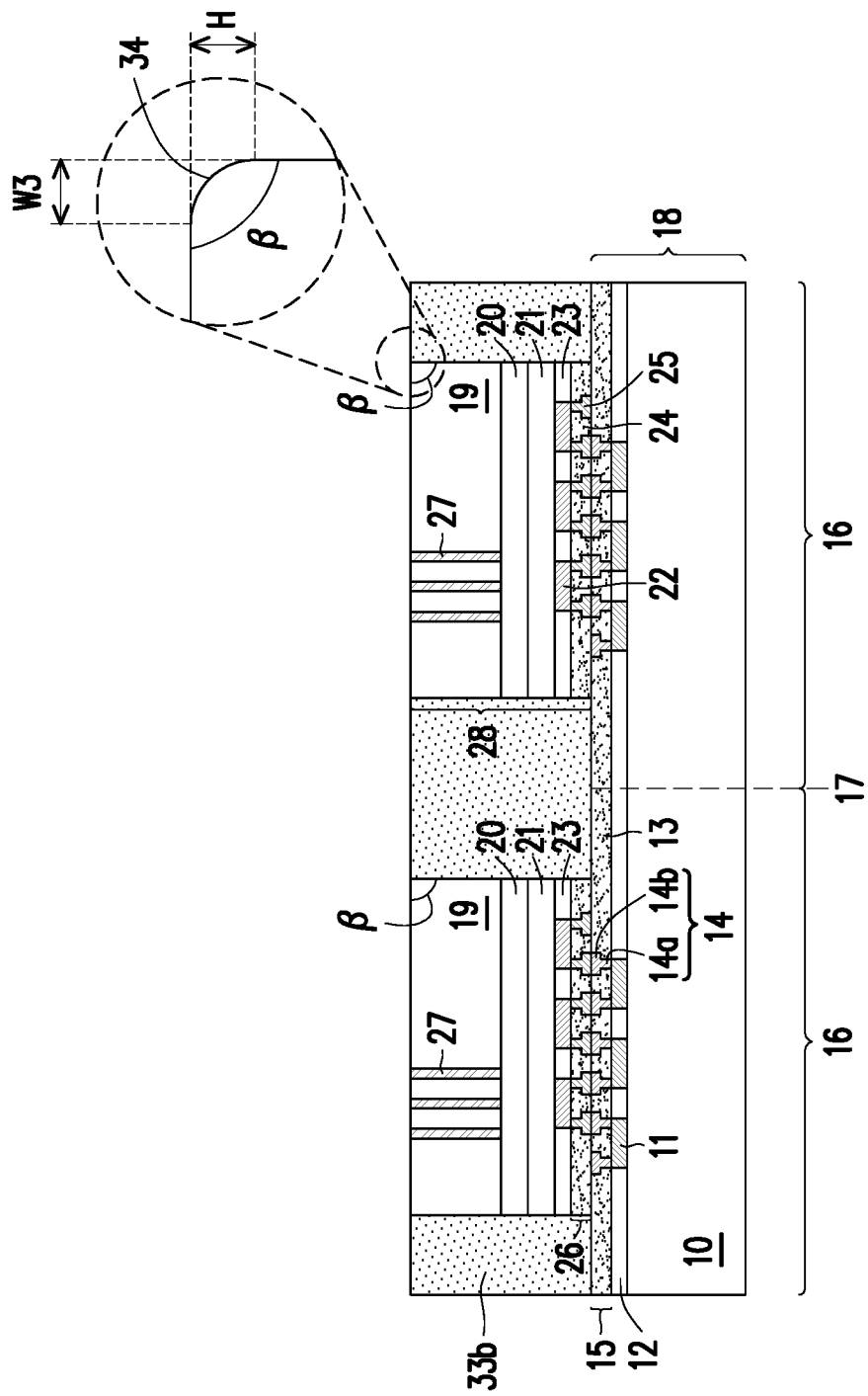

Referring to FIG. 1C and FIG. 1D, thereafter, a planarization process is performed to planarize the top surface of the dielectric material layer 33a and the top surfaces of the dies 28, so that a dielectric layer 33b is formed. In some embodiments, the protrusions 32a and a portion of the body part 31 of the dielectric material layer 33a, portions of the dies 28 are removed by the planarization process. The planarization process includes a chemical mechanical polishing (CMP) process, for example. In some embodiments, the slurry used in the CMP process has a selectivity ratio of the dielectric material layer 33a to the substrate 19 of the die 28. In some embodiments, the selectivity ratio of the dielectric material layer 33a to the substrate 19 ranges from 1:1 to 1:3 during the CMP process. In the embodiment, as a portion of the dielectric material layer 33a is removed before the CMP process is performed, the time and cost of the CMP process is reduced.

Referring to FIG. 1D, the dielectric layer 33b is formed laterally aside the dies 28 to cover sidewalls of the dies 28. In some embodiments, the top surface of the dielectric layer 33b is substantially coplanar with the top surfaces of the dies 28. In some embodiments, the die 28 may be thinned during the planarization process. In some embodiments, a portion of the substrate 19 of the die 28 is removed, and the TSVs 27 of the die 28 are exposed.

In the embodiments, as the corners α is covered and protected by the dielectric material layer 33a during the planarization process, the corner rounding issue of the die 28 is avoided or reduced. In some embodiments, after the planarization process is performed, the corner α of the die 28 is partially removed or completely removed, and corners β of the die 28 are formed. In some embodiments, the corner β of the die 28 is 90°. In some embodiments, the corner β includes a rounding portion 34. The width W3 of the rounding portion 34 is less than 0.4 µm, the height H of the rounding portion 34 is less than 0.2 µm, for example. The rounding portion 34 is connected to the top surface and the sidewall of the die 28. The outer profile of the rounding portion 34 is arced, curved, inclined, or the like.

Figure 1E:
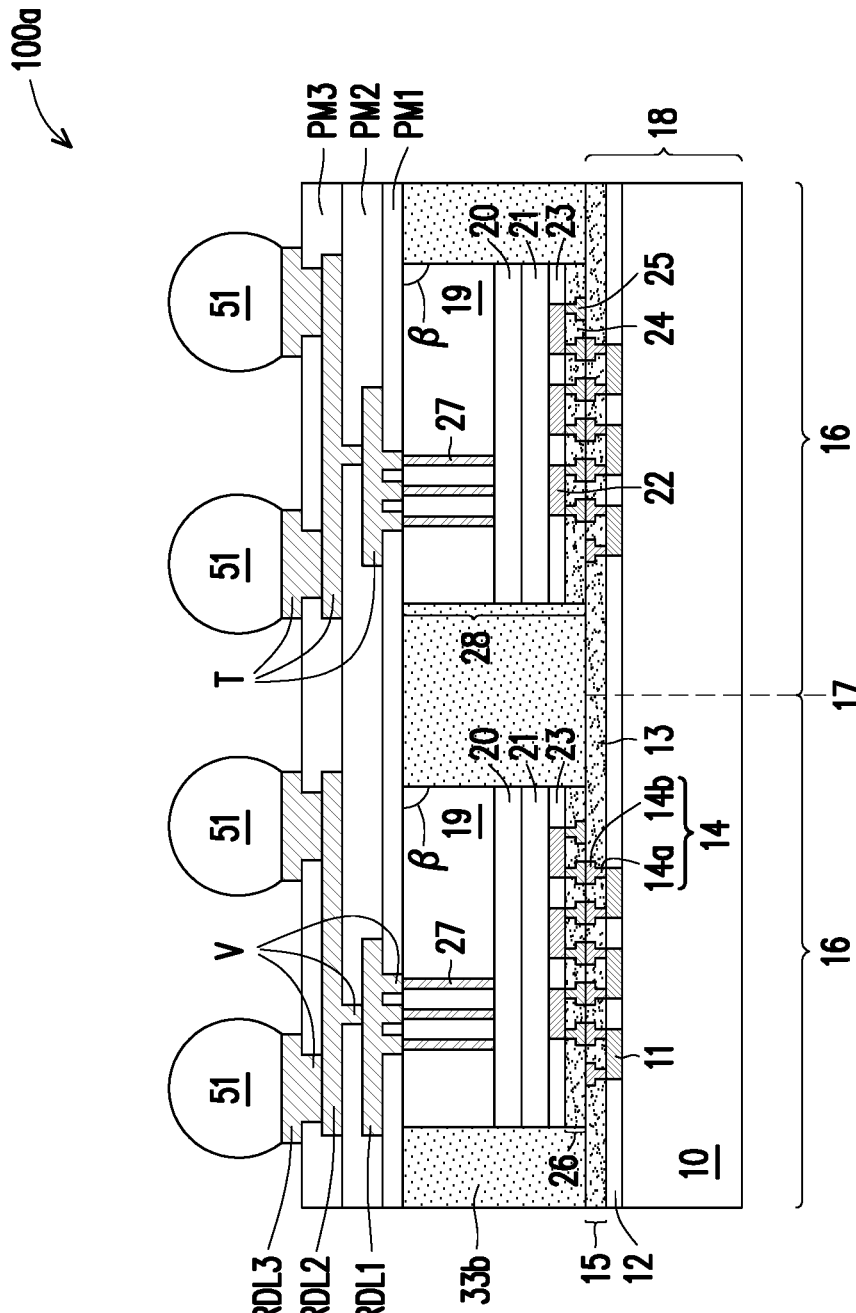

Referring to FIG. 1E, a RDL structure 50 is formed on the dies 28 and the dielectric layer 33b. The RDL structure 50 is electrically connected to the dies 28 and the wafer 18. In some embodiments, the RDL structure 50 is formed at back sides of the dies 28 and referred to as a "back-side redistribution layer structure", through the specification, wherein the "back-side" refers to a side opposite to a "front-side" which is close to the pads 22 of the die 28.

In some embodiments, the RDL structure 50 includes a plurality of polymer layers PM1, PM2, PM3 and a plurality of redistribution layers RDL1, RDL2, RDL3 stacked alternately. The number of the polymer layers or the redistribution layers shown in FIG. 1E is merely for illustration, and the disclosure is not limited thereto. The redistribution layer RDL1 penetrates through the polymer layer PM1 and is electrically connected to the TSVs 27 of the die 28. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. In some embodiments, each of the polymer layers PM1, PM2 and PM3 includes a photo-sensitive material such as PBO, PI, BCB, a combination thereof or the like. In some embodiments, each of the redistribution layers RDL1, RDL2 and RDL3 includes conductive materials. The conductive materials include metal such as copper, nickel, titanium, a combination thereof or the like, and is formed by an electroplating process. In some embodiments, the redistribution layers RDL1, RDL2 and RDL3 respectively includes a seed layer (not shown) and a metal layer formed thereon (not shown). The seed layer may be a metal seed layer such as a copper seed layer. The metal layer may be copper or other suitable metals.

In some embodiments, the redistribution layers RDL1, RDL2 and RDL3 respectively includes a plurality of vias V and a plurality of traces T connected to each other. The vias V penetrate through the polymer layers PM1, PM2, PM3 to connect the traces T of the redistribution layers RDL1, RDL1, RDL3, and the traces T are respectively located on the polymer layers PM1, PM2, PM3, and are respectively extending on the top surface of the polymer layers PM1, PM2, PM3.

In some embodiments, the redistribution layer RDL3 is the topmost redistribution layer of the RDL structure 50, and is referred as an under-ball metallurgy (UBM) layer for ball mounting. A plurality of connectors 51 are formed on the redistribution layer RDL3 of the RDL structure 50. In some embodiments, the connectors 51 are referred as conductive terminals. The connectors 51 are electrically connected to the die 28 through the RDL structure 50. In some embodiments, the connectors 51 are made of a conductive material with low resistivity, such as Sn, Pb, Ag, Cu, Ni, Bi or an alloy thereof, and are formed by a suitable process such as ball placement process and reflow process, evaporation, plating, or screen printing. In alternative embodiments, the connectors 51 may be controlled collapse chip connection (i.e. C4) bumps formed by a C4 process.

Referring to FIG. 1E, a 3DIC structure 100a is thus completed, the 3DIC structure 100a includes the wafer 18, the dies 28, the dielectric layer 33b, the RDL structures 50 and the connectors 51. The dies 28 are electrically bonded to the wafer 18 by a hybrid bonding structure 30. The connectors 51 are electrically connected to the dies 28 and the wafer 18 through the RDL structure 50.

In the first embodiment, one layer of the dies 28 are bonded to the wafer 18, but the disclosure is not limited thereto. In some other embodiments, more than one layer of dies are bonded to the wafer 18, and the number of the layers of dies may be adjusted according to the product design. Herein, the number of the layers of dies refers to the number of the dies stacked on the wafer in a direction perpendicular to the top surface of the wafer.

Referring to FIG. 1D and FIG. 2, in some other embodiments, a 3DIC structure 100b may include two layers of dies 28 and 128 stacked on the wafer 18. In some embodiments, after the planarization process is performed, processes similar to FIG. 1A to FIG. 1D are performed, such that the dies 128 are stacked on the dies 28 and the wafer 18, and the dielectric layer 37 covering sidewalls of the dies 128 is formed on the dielectric layer 33b. In some embodiments, the dies 128 may be the same types of dies or different types of dies, the dies 128 and the dies 28 may be the same types of dies or different types of dies. The structure of the die 128 may be the same as or different from those of the die 28. The dies 128 are bonded to the dies 28 through a hybrid bonding process, for example. It is mentioned that, the location of the TSVs 27 in the die 28 is not limited to that is shown in FIG. 1A to FIG. 1E, and may be adjusted according to the product design as shown in FIG. 2.

In some embodiments, similar to the die 28, the die 128 includes a substrate 119 with TSVs 127 therein, a device layer 120, an interconnect structure 121, a plurality of pads 122, a dielectric layer 123 and a bonding structure 126 including a dielectric layer 124 and a conductive feature 125. The bonding structure 126 is bonded to the top surface (that is, the back surface) of the die 28. In detail, the conductive feature 125 is bonded to the TSVs 27 of the die 28, the dielectric layer 124 is bonded to the substrate 19 of the die 28. In other words, the die 128 and the die 28 are configured as face to end, but the disclosure is not limited thereto. In some other embodiments, the die 128 and the die 28 may be configured as face to face (not shown).

After the dies 128 are bonded to the dies 28 and the dielectric layer 37 is formed, processes described in FIG. 1E are performed to form the RDL structure 50 and the connectors 51, and the 3DIC structure 100b is thus completed.

The 3DIC structure 100b includes the wafer 18, the dies 28, the dies 128, the dielectric layer 33b, the dielectric layer 37, the RDL structure 50 and the connectors 51. The connectors 51 are electrically connected to the dies 128, the dies 28 and the wafer 18.

In the first embodiments, protrusions of the dielectric material layer are formed on each of the dies bonded on the wafer, but the disclosure is not limited thereto. In some embodiments, protrusions may be formed on edge region of the dies on a region of the wafer in which the likelihood of the occurrence of rounding corner issue is high, and not formed on the dies on a region in which the likelihood of the occurrence of rounding corner issue is low.

Figure 3A:
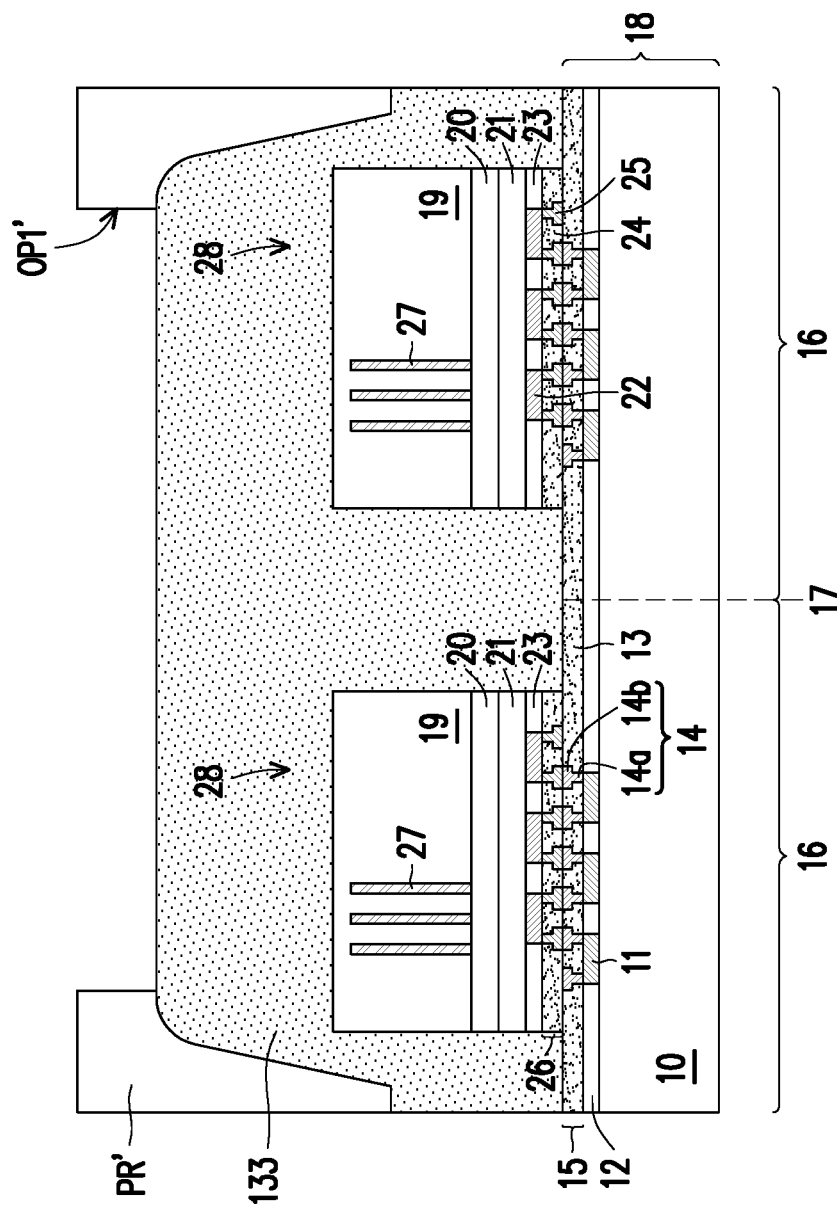
FIG. 3A to FIG. 3B are schematic cross-sectional views illustrating a method of forming a 3DIC structure according to a second embodiment.
Figure 3B:
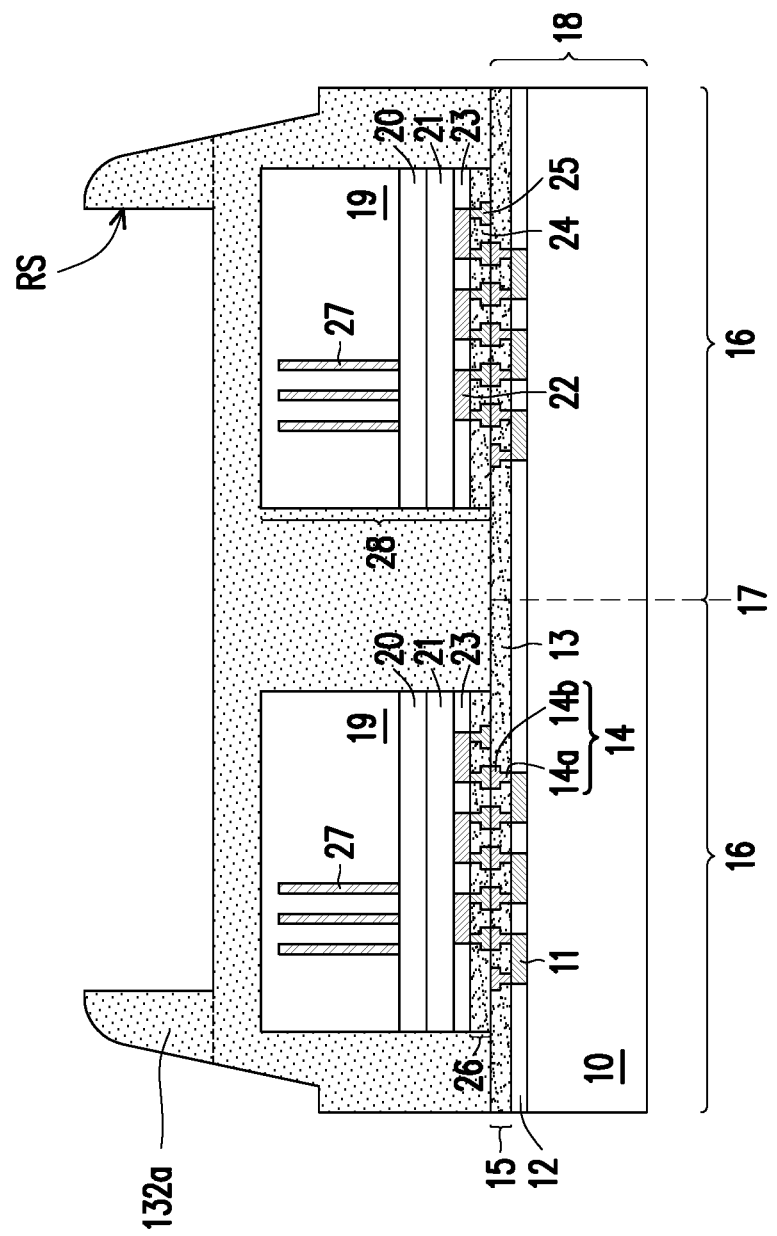

FIG. 3A to FIG. 3B illustrate a method of forming a 3DIC structure according to a second embodiment. The second embodiment is similar to the first embodiment, except that the locations of the openings of the mask layers in the two embodiments are different.

Referring to FIG. 3A, after the dies 28 are bonded to the wafer 18, a dielectric material layer 133 is formed on the dies 28 and the wafer 18. The material and the structural feature of the dielectric material layer 133 may be the same as or different from those of the dielectric material layer 33 (FIG. 1A), and is not described again. The dielectric material layer 133 covers the top surface of the wafer 18, the sidewalls and top surfaces of the dies 28.

A mask layer PR' including at least one openings OP1' is formed on the dielectric material layer 133, the material and the forming method of the mask layer PR' is substantially the same as those of the mask layer PR in the first embodiment, the difference lies in that, the opening OP1' of the mask layer PR' exposes the dielectric material layer 133 covering at least two dies 28. That is, the opening OP1' is located within the region of at least two dies 28, and overlapped with at least two dies 28.

Referring to FIG. 3B, a removal process is performed to remove a portion of the dielectric material layer 133 on the dies 28, and a dielectric material layer 133a including a recess RS is formed. The removal process is an etching process such as an anisotropic etching process, an isotropic etching process, or a combination thereof. In some embodiments, the etching process includes a wet etching process, a dry etching process, or a combination thereof. In some embodiments, the removal process is stopped until the top surfaces of the dies 28 are exposed. That is, the recess RS exposes the top surfaces of at least two adjacent dies 28, but the disclosure is not limited thereto. In some other embodiments, the removal process is stopped before the top surfaces of the dies 28 are exposed. That is, the recess RS is located over the dies 28, but not expose the top surfaces of the dies 28. In some embodiments, the recess RS is overlapped with at least two dies 28.

Figure 4B:
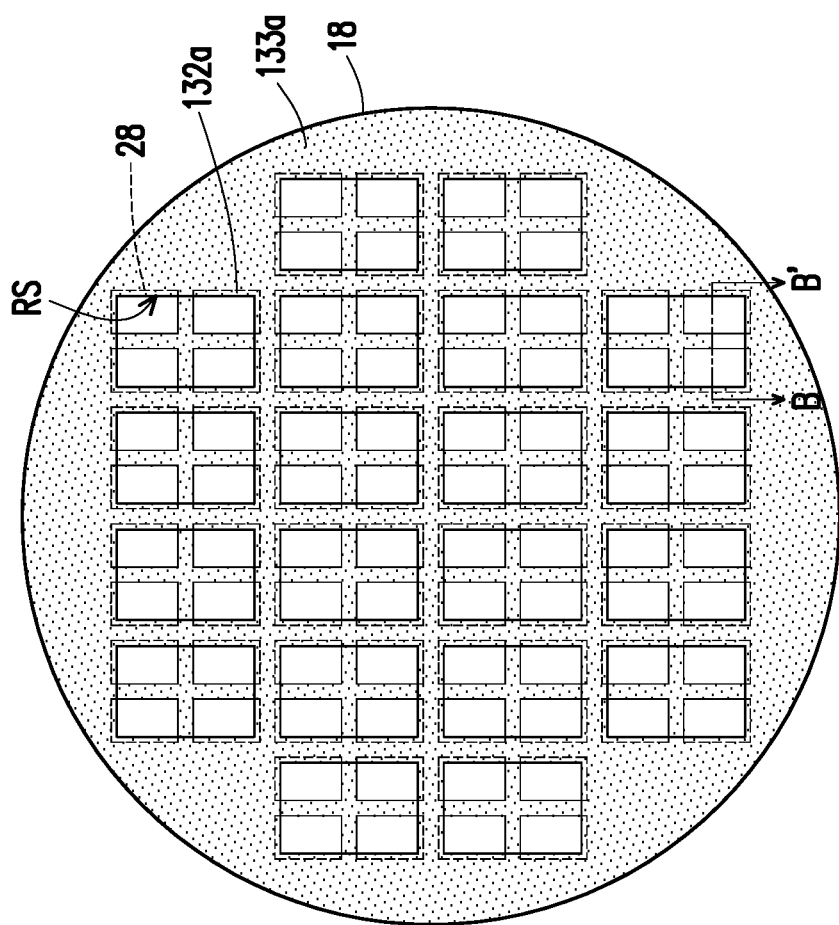
Figure 4C:
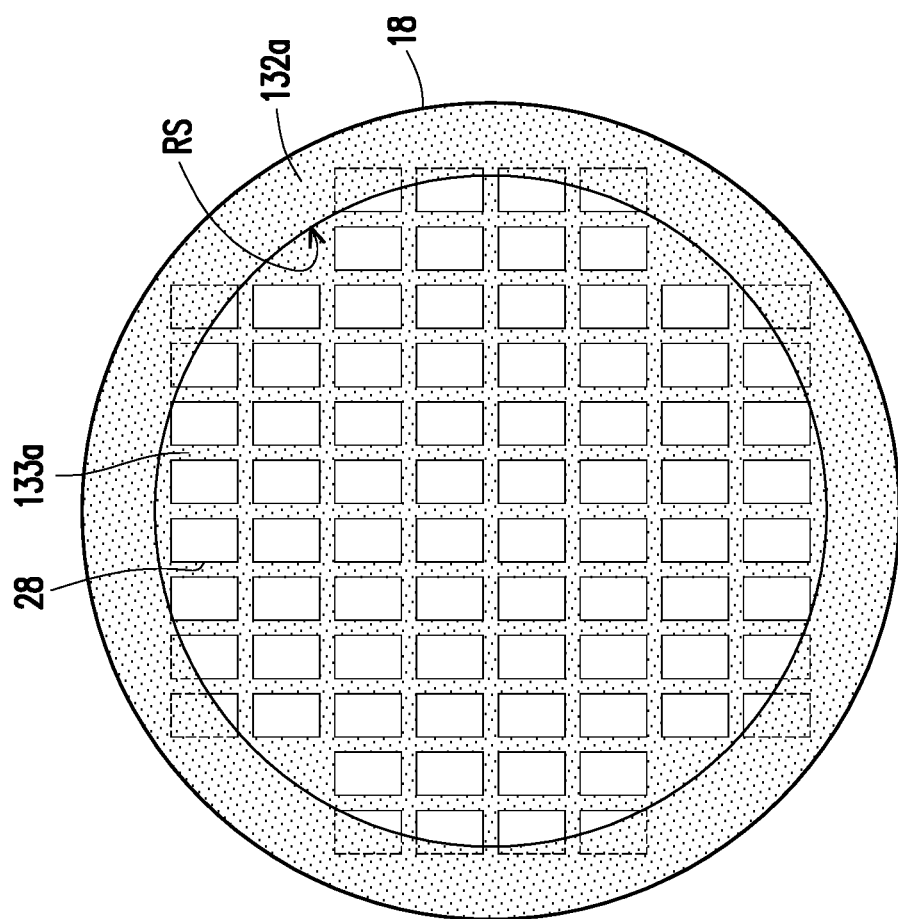

FIGS. 4B and 4C are the top views illustrating the dielectric material layer 133a on the dies 28 and the wafer 18 according to some embodiments of the disclosure. It is noted that, the two dies 28 shown in FIGS. 3A and 3B may be referred to any two dies on the wafer 18. In some embodiments, FIG. 3B is a cross-sectional view taken along a B-B' line of FIG. 4B, for example. In some embodiments, the two dies 28 shown in FIGS. 3A and 3B may be two dies on edge of the wafer 18, other dies may be arranged between the two dies 28, and are not shown for the sake of brevity.

Referring to FIG. 3B and FIG. 4B, in some embodiments, the dielectric material layer 133a includes one or more protrusions 132a surrounding the one or more recesses RS. In some embodiments, the recess RS is located over and overlapped with at least two adjacent dies 28, the protrusion 132a is surrounding the recess RS and covering the portions of the edge regions of the dies 28.

Referring to FIG. 4B, illustrated is an example showing the recess RS at the corresponding position over four dies 28 arranged in a 2×2 array. The protrusion 132a is located on portions of edge regions ER of the four dies 28. In other words, each recess RS is located over and overlapped with the four dies 28 in 2×2 array.

Referring to FIG. 3B and FIG. 4C, in some embodiments, the recess RS is located over and overlapped with a plurality of dies 28, the recess RS is formed over the non-edge region of the wafer 18, and the protrusion 132 covers at least portions of corners of the dies 28 on an edge region of the wafer 18. The protrusion 132 may have a shape similar to the shape of the wafer 18 and a smaller area than that of the wafer 18 when viewed in the top view.

The locations of the recess RS and the protrusion 132a shown in the figures are just for illustration, and the disclosure is not limited thereto. The recess RS may be over the dies 28 arranged in any kind of arrangement, as long as the protrusions 132 cover at least portions of edges of the dies 28, and the corner rounding issue of the dies 28 are avoided or reduced in subsequent processes.

After the recess RS is performed, processes similar to those described in FIGS. 1D and 1E are performed, and the 3DIC structure 100a or 100b may be further formed.

In the forgoing embodiments, the RDL structure is formed on a back side of the die, but the disclosure is not limited thereto. In some other embodiments, the RDL structure may be formed on a front side of the die, which is described as below.

Figure 5C:
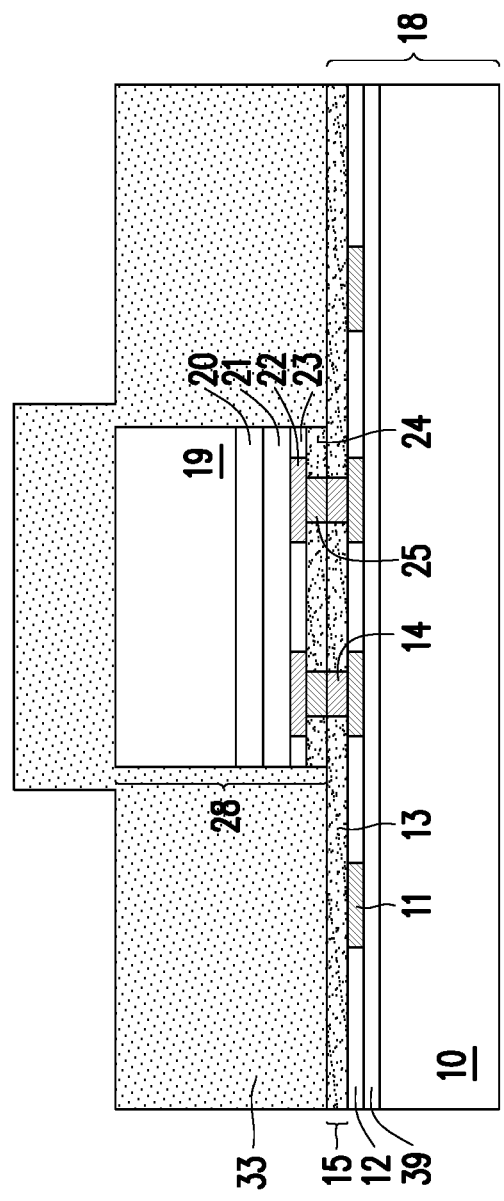
FIG. 5A to FIG. 5N are schematic cross-sectional views illustrating a method of forming a 3DIC structure according to a third embodiment of the disclosure.
Figure 5D:
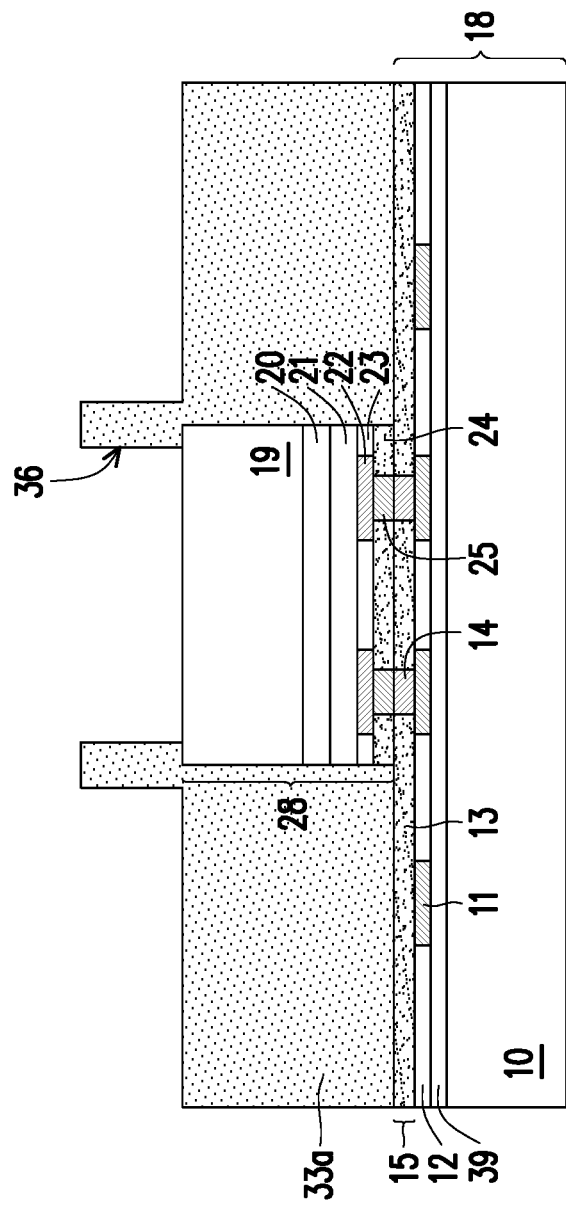
Figure 5E:
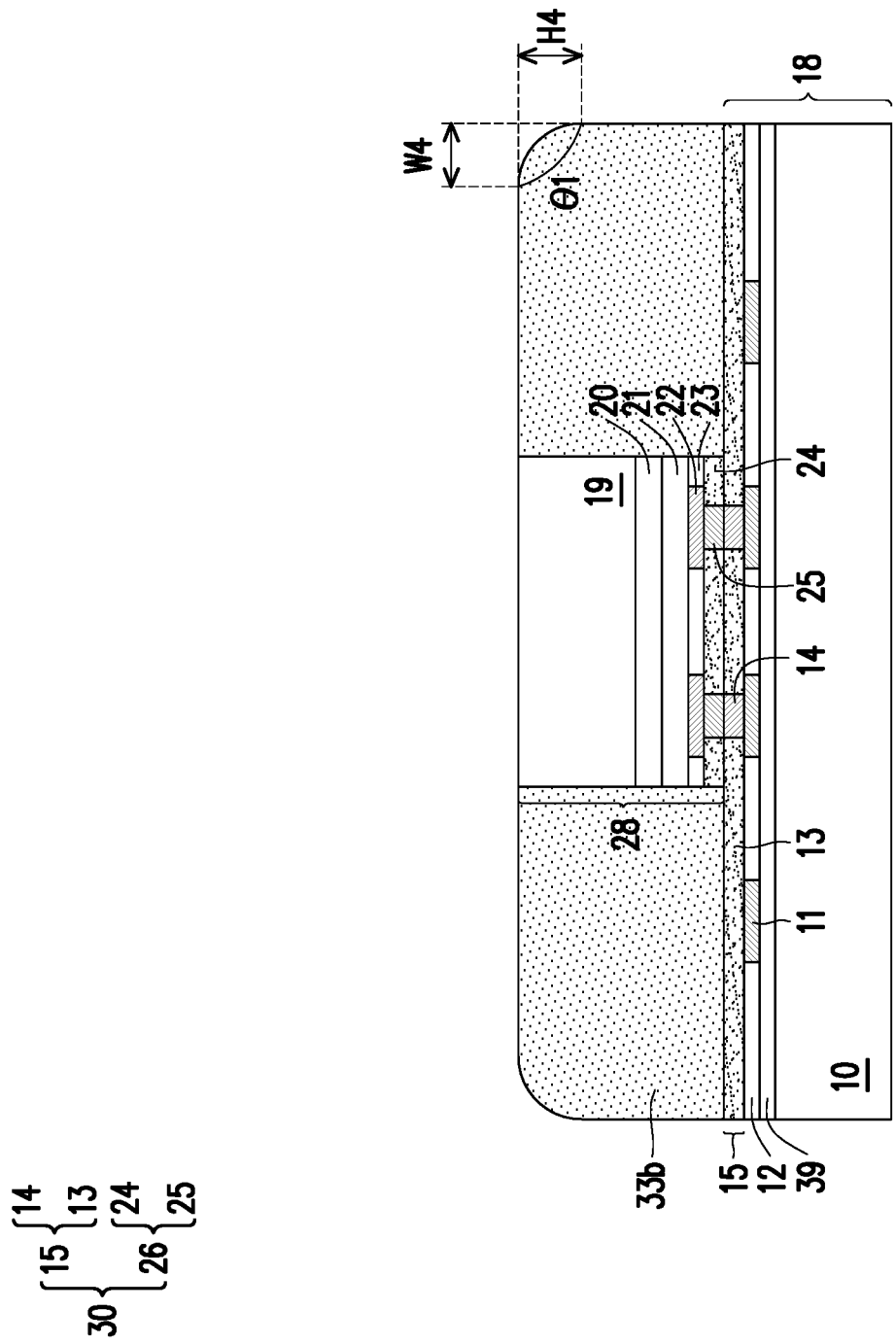
Figure 5F:
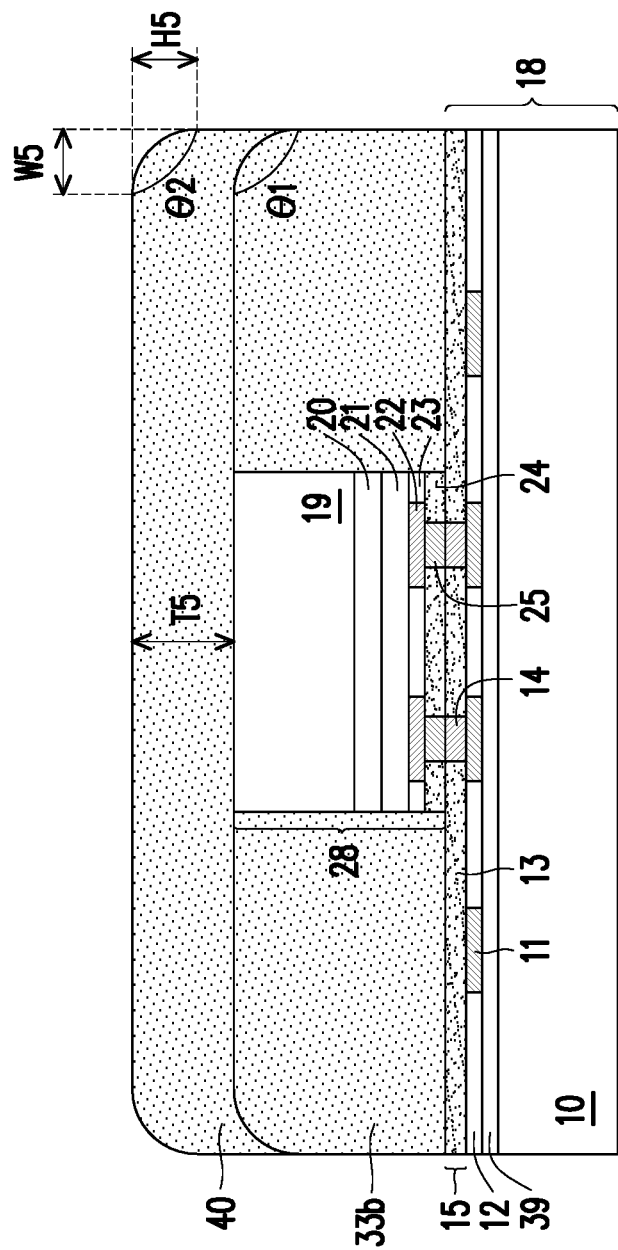
Figure 5G:
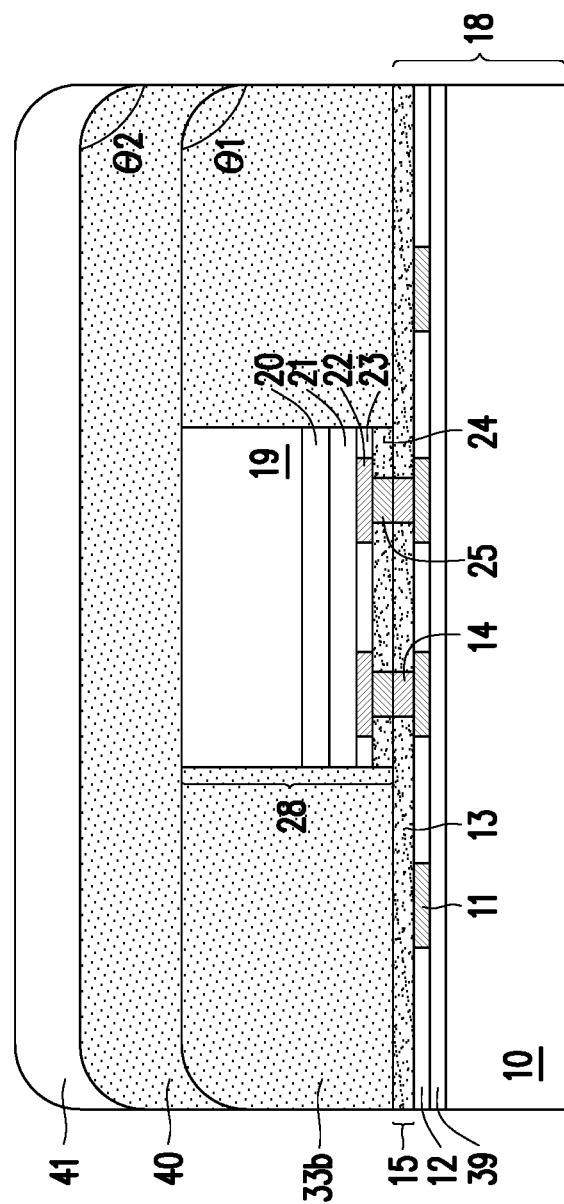
Figure 5H:
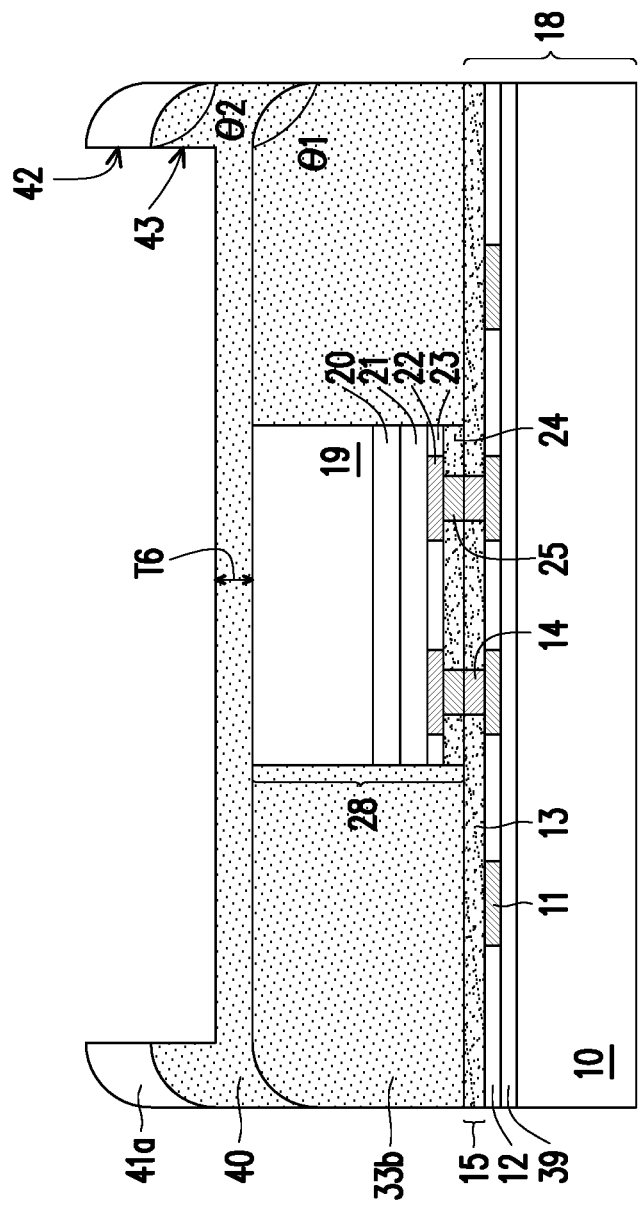
Figure 5I:
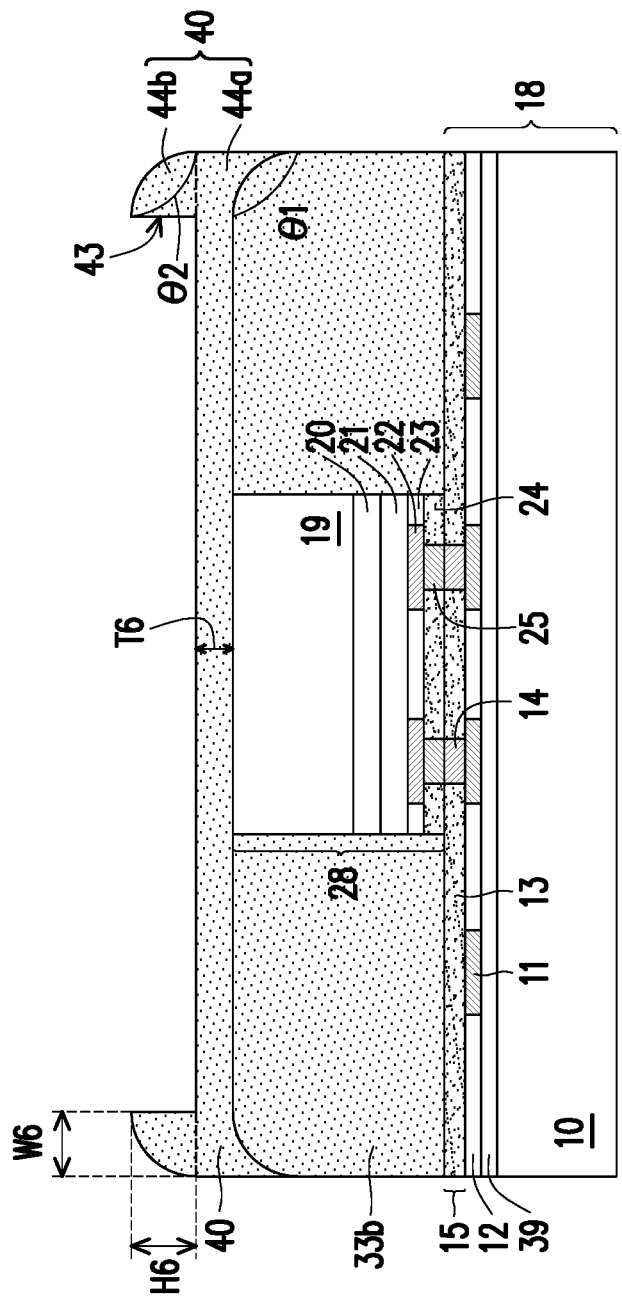
Figure 5J:
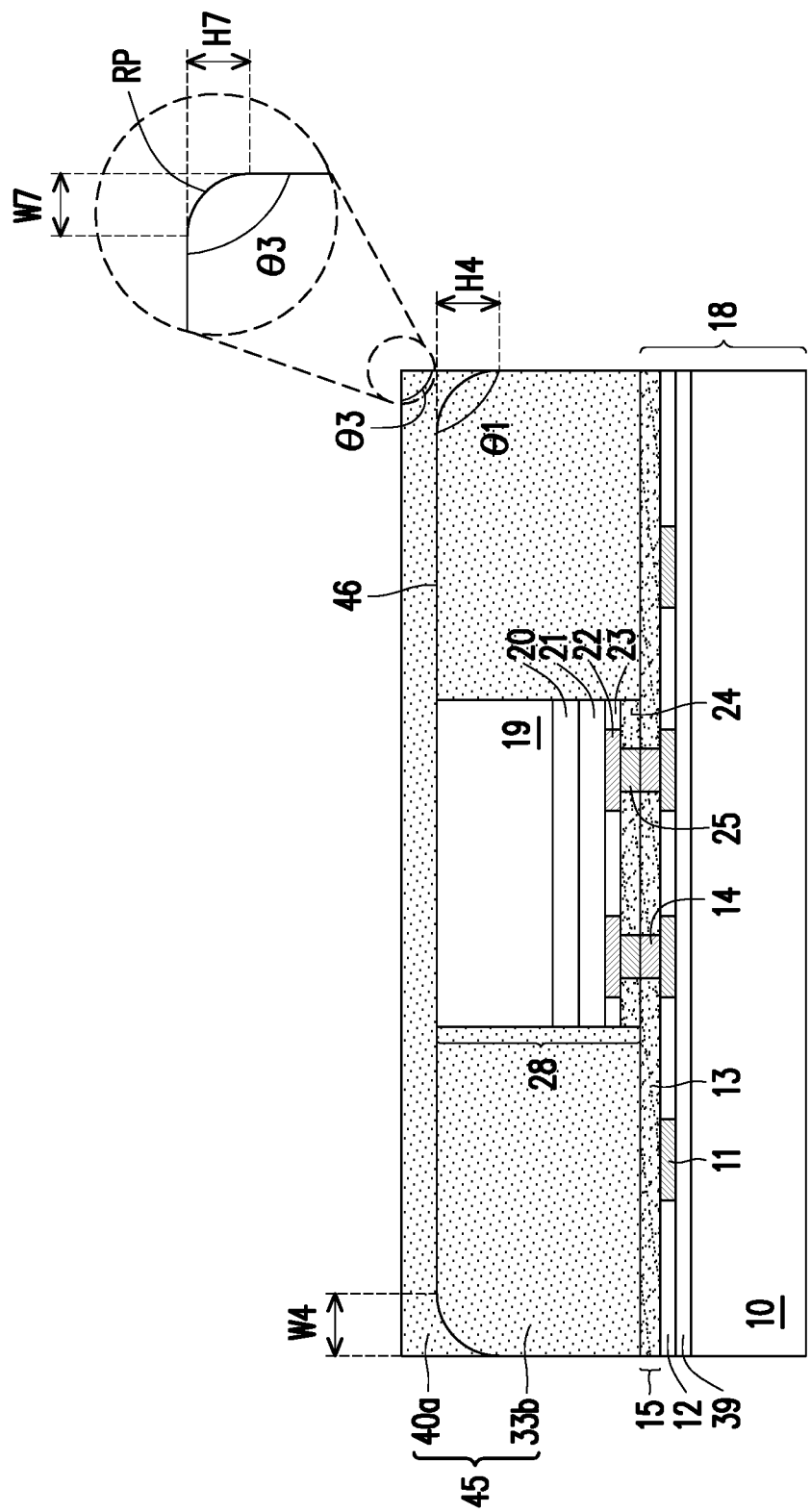
Figure 5K:
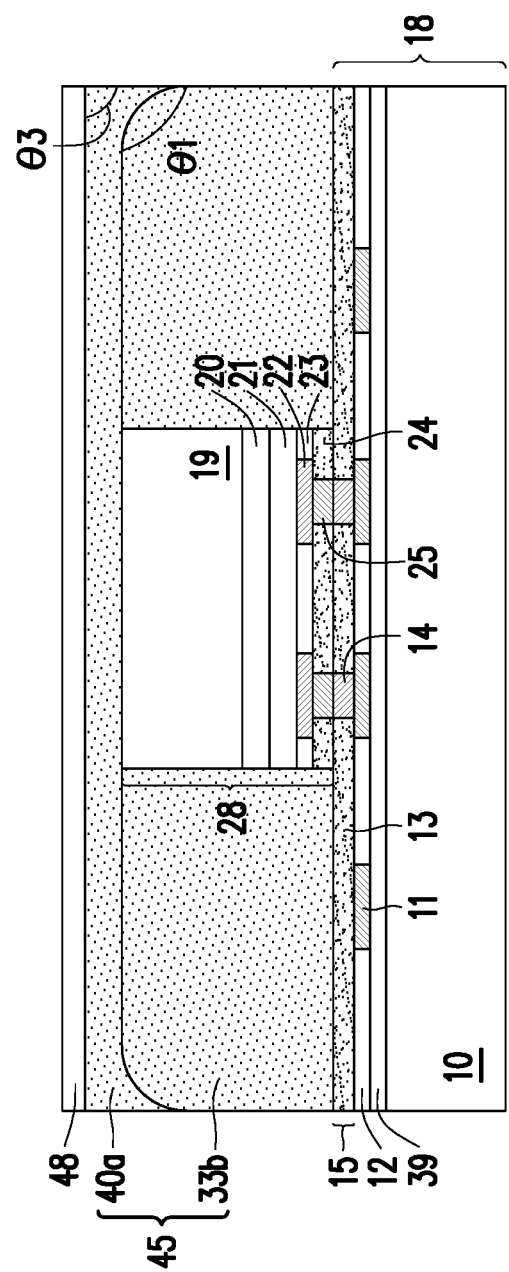
Figure 5L:
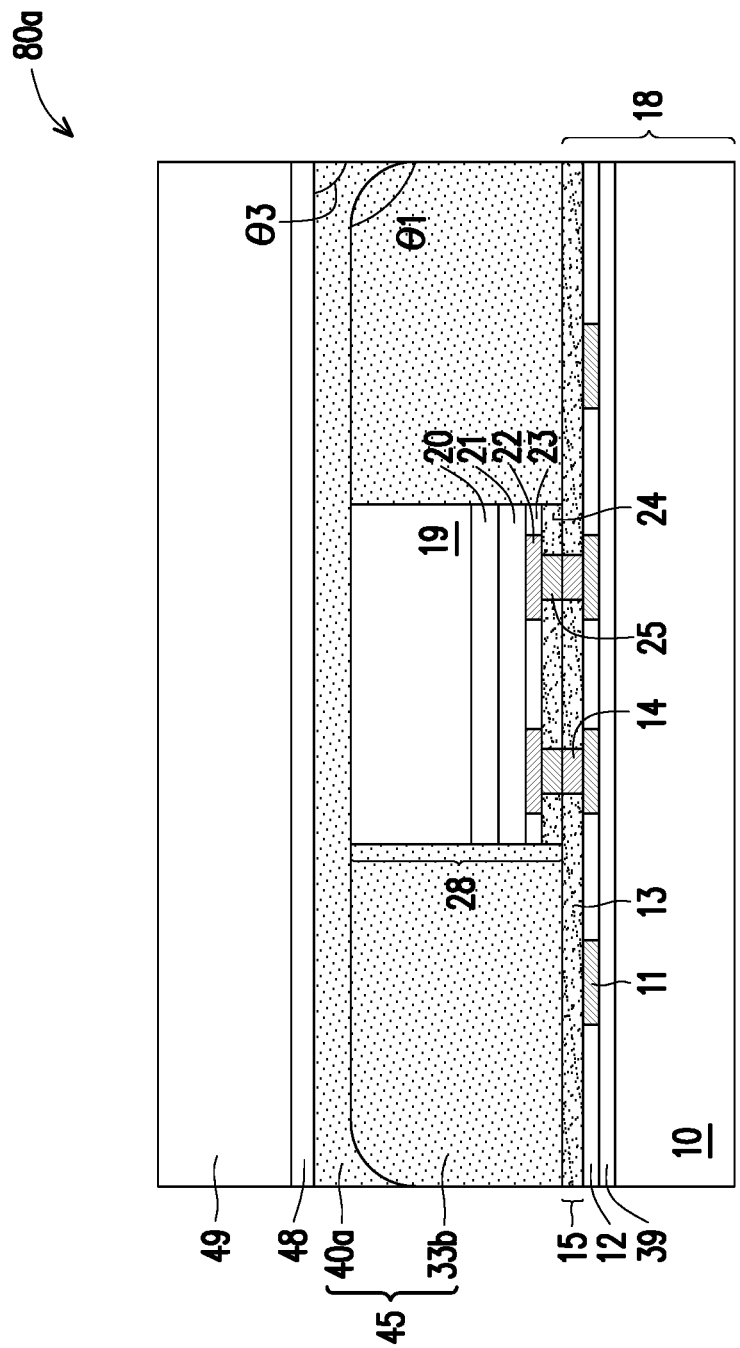
Figure 5M:
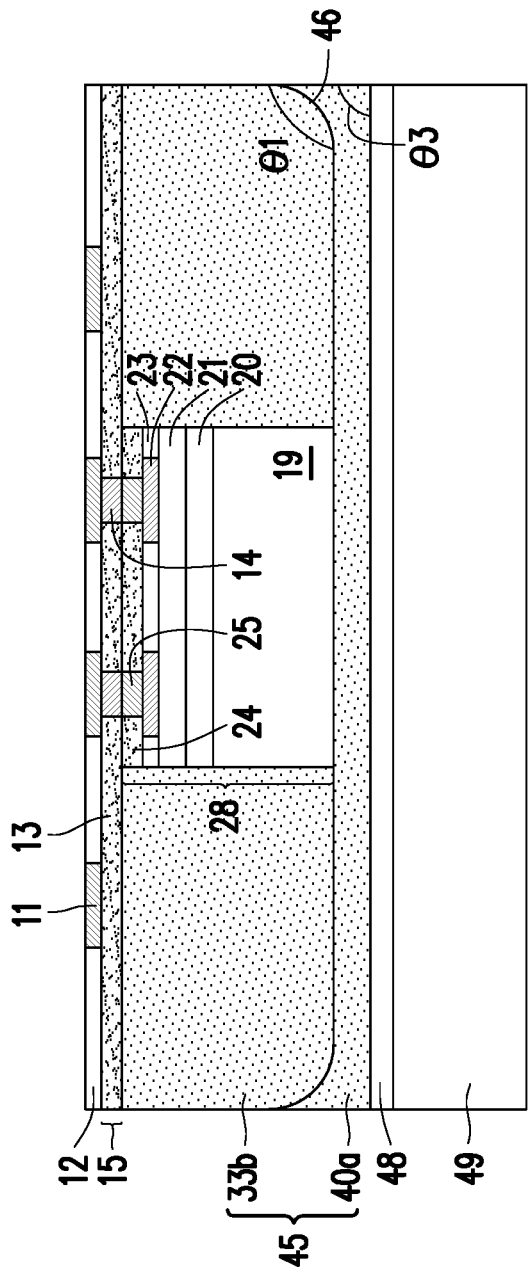
Figure 5N:
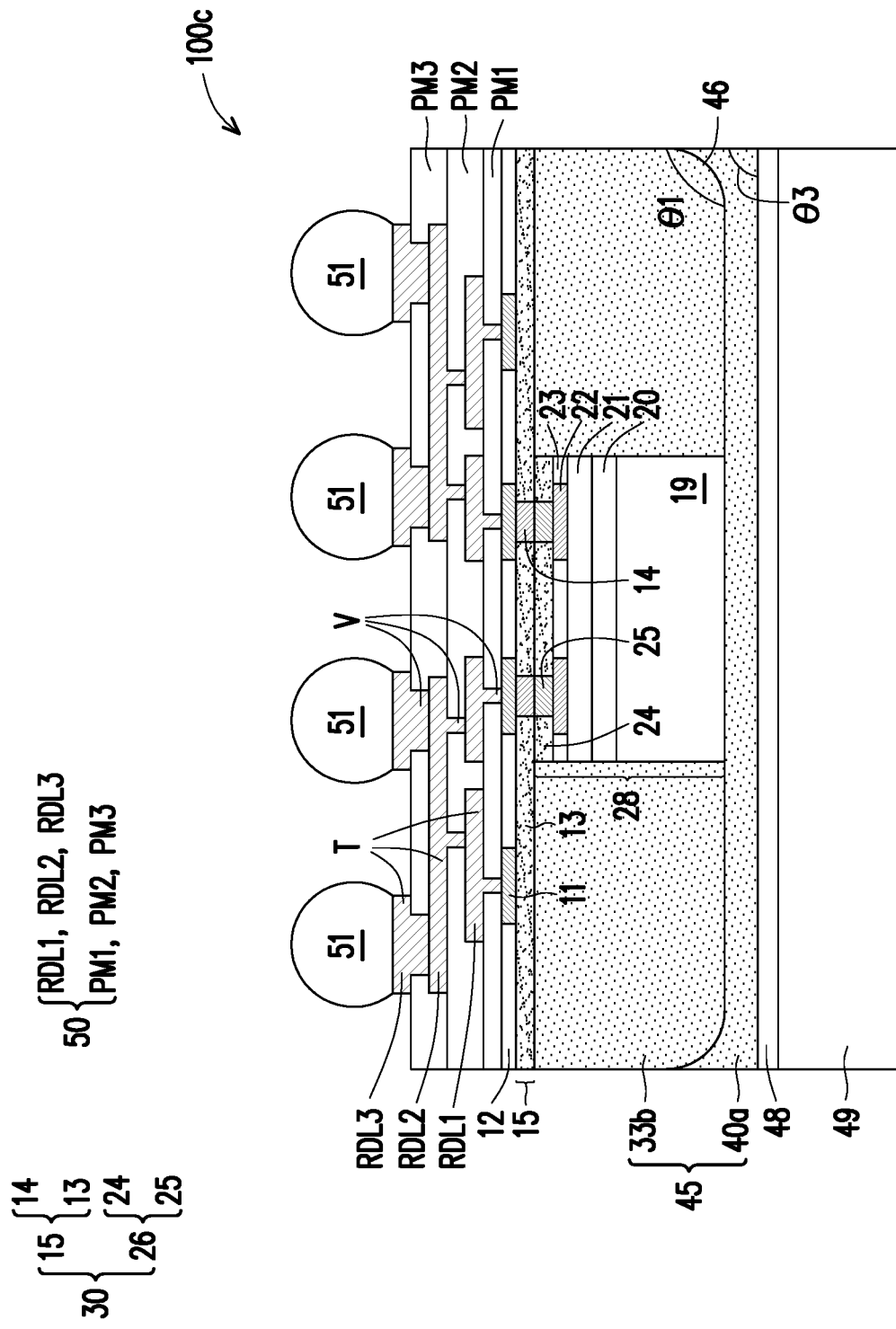

FIG. 5A to FIG. 5N are schematic cross-sectional views illustrating a method of forming a 3DIC structure according to a third embodiment of the disclosure.

Referring to FIG. 5A, similar to the first embodiment, a die 28 is bonded to a wafer 18 through a bonding structure 30. In some embodiments, the bonding structure 30 is a hybrid bonding structure, but the disclosure is not limited thereto. For the sake of brevity, one die 28 is shown in FIG. 5A. It is understood that the number of the die 28 bonded to the wafer 18 shown in FIG. 5A is merely for illustration, and the disclosure is not limited thereto. In some embodiments, the height H1 of the die 28 ranges from 30 µm to 775 µm. The structures of the die 28 and the wafer 18 may be substantially the same as or different from those described in the first embodiment. In some embodiments, the die 28 does not include TSVs. As shown in FIG. 5A, the cross-section shapes of the conductive features 14 and 25 comprised in the bonding structures 15 and 26 of the wafer 18 and the die 28 are not T-shaped, and may be rectangle or square.

In some embodiments, the wafer 18 may further includes a stop layer 39 formed on the substrate 10. The stop layer 39 may be formed between the substrate 10 and pads 11 and the dielectric layer 12. In some embodiments, the material of the stop layer 39 is different from the material of the dielectric layer 12. The stop layer 39 includes silicon oxide, silicon nitride, silicon oxynitride, or a combination thereof, for example. The stop layer 39 may be formed by a suitable technique such as CVD, spin coating, or the like. In some embodiments, the wafer 18 may not include devices therein, and may include an interconnect structure on the substrate 10. For the sake of brevity, the interconnect structure is not specifically shown. The pads 11 and the dielectric layer 12 may be referred as a part of the interconnect structure.

Referring to FIG. 5B, in some embodiments, after the die 28 is bonded to the wafer 18, a thinning process is performed to remove a portion of the substrate 19 of the die 28, such that the die 28 is thinned. The thinning process includes a grinding process, a CMP process, or a combination thereof. In some embodiments, after the thinning process is performed, the height H2 of the die 28 ranges from 5 µm to 50 µm.

Referring to FIGS. 5C to 5E, processes similar to those from FIG. 1A to FIG. 1D are performed, such that a dielectric layer (or referred as a first dielectric layer) 33b is formed on the wafer 18 and laterally aside the die 28.

Referring to FIG. 5C, a dielectric material layer 33 is formed on the wafer 18 and the dies 18. The material, the forming method and the structural features of the dielectric material layer 33 may be substantially the same as or different from those in the first embodiment, and are not described again.

Referring to FIG. 5D and FIG. 5E, one or more openings or recesses 36 are formed in the dielectric material layer 33. A planarization process is then performed to remove a portion of the dielectric material layer 33a, and the dielectric layer 33b is formed to cover the sidewalls of the die 28. In some embodiment, the top surface of the die 28 and the top surface of the dielectric layer 33b are substantially coplanar with each other. In some embodiments, the die 28 is further thinned, that is, a portion of the substrate 19 of the die 28 is removed during the planarization process, but the disclosure is not limited thereto. In some other embodiments, the die 28 is not thinned during the planarization process.

Referring to FIG. 5E, in some embodiments, after the planarization process is preformed, the edge of the dielectric layer 33b on edge of the wafer 18 may be rounded. That is to say, the corner $\theta 1$ of the dielectric layer 33b may include a rounding portion and may be referred as a rounding corner $\theta 1$. The rounding corner $\theta 1$ is connected to the top surface and sidewall of the dielectric layer 33b. The profile of the rounding corner $\theta 1$ is arced, curved, rounded, or the like. The width W4 of the rounding corner $\theta 1$ in a direction parallel with the top surface of the die 28 ranges from 1 mm to 20 mm, the height H4 of the rounding corner $\theta 1$ in a direction perpendicular to the top surface of the die 28 ranges from 5 µm to 30 µm, for example.

Referring to FIG. 5F, a dielectric material layer 40 is formed on the die 28 and the dielectric layer 33b to cover the top surfaces of the die 28 and the dielectric layer 33b. The material and the forming method of the dielectric material layer 40 are similar to, the same as or different from those of the dielectric material layer 33. In some embodiments, the outer profile of the dielectric material layer 40 is conformal with outer profile of the dielectric layer 33b and the die 28. In the embodiments in which the dielectric layer 33b has a rounding corner $\theta 1$, the dielectric material layer 40 also has a rounding corner $\theta 2$ over the rounding corner $\theta 1$ of the dielectric layer 33b and over the edge of the wafer 18. The rounding corner $\theta 2$ is connected to the top surface and sidewall of the dielectric material layer 40. In some embodiments, the width W5 of the rounding corner $\theta 2$ ranges from 1 mm to 20 mm, the height H5 of the rounding corner $\theta 2$ ranges from 5 µm to 30 µm, for example. The width W5 and the height H5 of the rounding corner $\theta 2$ may be the same as or different form the width W4 and the height H4 of the rounding corner $\theta 1$, respectively. The thickness T5 of the dielectric material layer 40 on the die 28 is larger than or at least equal to the height H5 of the rounding corner $\theta 2$.

Referring to FIG. 5G and FIG. 5H, a portion of the dielectric material layer 40 is removed by photolithography and etching processes. In detail, a mask layer 41 is formed on the dielectric material layer 40. The mask layer 41 is, for example, a photoresist. Thereafter, the mask layer 41 is patterned by exposure and development processes, and a patterned mask 41a having an opening 42 is formed. The patterned mask 41a covers a portion of the dielectric material layer 40 on edge of the wafer 18. In some embodiments, the patterned mask 41a covers the rounding corner $\theta 2$ of the dielectric material layer 40 over the edge of the wafer 18, and exposes the dielectric material layer 40 on the non-edge region of the wafer 18.

Thereafter, a removal process such as an etching process with the patterned mask 41a as a mask is performed, so as to remove a portion of the dielectric material layer 40 exposed by the opening 42 of the patterned mask 41a, and a recess 43 is formed in the dielectric material layer 40. In some embodiments, after the removal process is performed, the top surface of the die 28 is still covered by the dielectric material layer 40. In some embodiments, the rounding corner $\theta 2$ is remained.

Referring to FIG. 5I, the patterned mask 41a is then stripped. The dielectric material layer 40 has a recess 43, and a portion of the dielectric material layer 40 on edge of the wafer 18 is protruding from the bottom surface of the recess 43. In other words, the dielectric material layer 40 includes a lower portion 44a and a protruding portion 44b on the lower portion 44a. The lower portion 44a is located on the die 28 and the dielectric layer 33b. The protruding portion 44b is on the edge of the lower portion 44a and the edge of the wafer 18. The recess 43 is in a region enclosed by the sidewall of the protruding portion 44b. In other words, the recess 43 is defined by a top surface of the lower portion 44a and sidewalls of the protruding portion 44b of the second dielectric material layer 40. In some embodiments, the cross-section shape of the protruding portion 44b is sector, triangle, teeth-shaped, or the like. The inner sidewall of the protruding portion 44b may be straight or inclined, the outer sidewall of the protruding portion 44b may be rounding, arced or inclined.

The width W6 and the height H6 (that is, the depth of the recess 43) of the protruding portion 44b are substantially the same as or different form the width W5 and the height H5 of the rounding corner θ2 of the dielectric material layer 40, respectively. In some embodiments, the width W6 of the protruding portion 44b is larger than or equal to the width W5 of the rounding corner θ2, or/and the height H6 of the protruding portion 44b is larger than or equal to the height H5 of the rounding corner θ2.

Referring to FIG. 5I and FIG. 5J, a planarization process such as a CMP process is performed on the dielectric material layer 40, so as to form a dielectric layer (or referred as a second dielectric layer) 40a with substantially flat top surface. In some embodiments, the protruding portion 44b and a portion of the lower portion 44a of the dielectric material layer 40 are removed by the planarization process, but the disclosure is not limited thereto. In some other embodiments, the lower portion 44a is not removed during the planarization process. The thickness T6 of the dielectric layer 40a on the die 28 ranges from 0 to 5 µm, for example. In the embodiments, as a portion of the second dielectric material layer 40 is removed before the planarization process is performed, the cost and time of the planarization process is reduced.

Referring to FIG. 5J, as an etching process is previously performed to form the protruding portion 44b on edge of the wafer 18 before the planarization process is performed, the rounding issue may occur due to the planarization process is avoided or reduced. In some embodiments, the corner θ3 of the dielectric layer 40a is a right angle. In some other embodiments, a portion of the corner θ3 of the dielectric layer 40a is slightly rounded, and the corner θ3 includes a rounding portion RP. The rounding portion RP refers to the portion of the corner θ3 connected to the top surface and the sidewall of the second dielectric layer 40a and not parallel with or perpendicular to the top surface and the sidewall of the second dielectric layer 40a. In some embodiments, the rounding portion RP is arced, curved or inclined.

In some embodiments, the width W7 of the rounding portion RP of the second dielectric layer 40a is less than the width W4 of the rounding corner θ1 of the first dielectric layer 33b. The height H7 of the rounding portion RP is less than the height H4 of the rounding corner θ1. The width W7 of the rounding portion RP in a direction parallel with the top surface of the die 28 ranges from 0 to 10 µm, the height H7 of the rounding portion RP in a direction perpendicular to the top surface of the die 28 ranges from 0 to 5 µm. In other word, a length of the surface of the rounding portion RP of the second dielectric layer 40b is less than a length of the surface of the rounding corner θ1 of the first dielectric layer 33b. In some embodiments, the length of the surface of the rounding portion RP is zero. That is, the corner θ3 does not include the rounding portion and is a right angle. In other words, the edge of the second dielectric layer 40a is more flatten than the edge of the first dielectric layer.

In some embodiments, the second dielectric layer 40a covers the rounding corner θ1 of the first dielectric layer 33b. A portion of the second dielectric layer 40a on edge of the wafer 18 is laterally aside the first dielectric layer 33b and aside the die 28. In other words, the thickness of the second dielectric layer 40a on edge of the wafer 18 covering the rounding corner θ1 of the first dielectric layer 33b is larger than the thickness T6 of the second dielectric layer 40a on the die 28.

The dielectric layer 40a and the dielectric layer 33b form a dielectric structure 45. The dielectric structure 45 covers the top surface of the wafer 18, the sidewalls and the top surface of the die 28. An interface 46 is existed between the dielectric layer 40a and the dielectric layer 33b. In some embodiments, a portion of the interface 46 is extending along a direction parallel with the top surface of the die 28 or the wafer 18, and the end portion of the interface 46 is not parallel with the top surface of the die 28 or the wafer 18. In some embodiments, a portion of the interface 46 is substantially coplanar with the top surface of the die 28. The end portion of the interface 46 is arced, curved or inclined, and located at a level lower than that of the top surface of the die 28.

In some embodiments, the top surface (that is, back surface) of the die 28 is covered by the dielectric structure 45, that is, the top surface of the die 28 is lower than the top surface of the dielectric structure 45, but the disclosure is not limited thereto. In some embodiments, the planarization process may be performed until the top surface of the die 28 is exposed, and the top surface of the die 28 may be substantially coplanar with the top surface of the dielectric structure 45.

Referring to FIG. 5K, a bonding film 48 is formed on the dielectric structure 45, the bonding film 48 may include a dielectric material, a conductive material, or a combination thereof. The dielectric material includes silicon oxide, silicon nitride, silicon oxynitride, undoped silicate glass (USG), tetraethyl orthosilicate (TEOS), or a combination thereof. The conductive material includes aluminum, copper, nickel, gold, silver, tungsten, alloys thereof, or a combination thereof. The bonding film 48 is formed by a deposition process, electroplating process, or a combination thereof.

In some embodiments, the bonding film 48 is conformal with the dielectric structure 45, as the dielectric structure 45 has a substantially flat top surface, the bonding film 48 also has a substantially flat top surface. In some embodiments in which the corner θ3 of the second dielectric layer 40a includes a rounding portion, the corner of the bonding film may also be slight rounded and include a rounding portion. In some embodiments, after the bonding film 48 is formed, a planarization process such as a CMP process is further performed to further planarize the top surface of the bonding film 48, but the disclosure is not limited thereto. In some other embodiments, the CMP process may be omitted.

Referring to FIG. 5L, a carrier 49 is bonded to the bonding film 48 through, for example, a hybrid bonding process, a fusion bonding process, or a combination thereof. In some embodiments, the carrier 49 includes dielectric material, conductive material, semiconductor material, or a combination thereof. The dielectric material and the conductive material are substantially the same as or different from those included in the bonding film 48. The semiconductor material is, for example, silicon. In some embodiments, the carrier 49 is a blank wafer without device therein, but the disclosure is not limited thereto. In some other embodiments, the carrier 49 is a wafer with devices therein. The devices may be the same as or different from those may be included in the wafer 18 described in FIG. 1A.

In the embodiments, as the bonding film 48 has a substantially flat top surface, and the corner of the bonding film 48 is not rounded or slightly rounded, the adhesion between the bonding film 48 and the carrier 49 is improved. In some embodiments, the top surface of the bonding film 48 and the bottom surface of the carrier 49 are completely in contact with each other. In some embodiments, the contact area between the bonding film 48 and the carrier 49 is substantially equal to the area of the bottom surface of the carrier 49 (that is, the surface of the carrier 49 facing and contacting with the bonding film 48). In some embodiments, the ratio between the contact area between the bonding film 48 and the carrier 49 to the area of the bottom surface of the carrier 49 ranges from 0.99 to 1.

In some embodiments, the structure formed as shown in FIG. 5L may be referred as a 3DIC structure 80a.

Referring to FIG. 5M, the 3DIC structure 80a is turned over, a portion of the wafer 18 is removed by a removal process such as a grinding process, a polishing process, or the like, or a combination thereof. In some embodiments, the removal process is performed until the stop layer 39 is removed and the pads 11 of the wafer 18 are exposed.

Referring to FIG. 5N, a RDL structure 50 is formed on and electrically connected to the dies 28. In some embodiments, the RDL structure 50 includes a plurality of polymer layers PM1, PM2, PM3 and a plurality of redistribution layers RDL1, RDL2, RDL3 stacked alternately. The number of the polymer layers or the redistribution layers shown in FIG. 5N is merely for illustration, and the disclosure is not limited thereto. In this embodiment, the RDL structure 50 is formed on the front side of the die 28, and may be referred as a front-side RDL structure. The RDL structure 50 is electrically connected to the die 28 through the wafer 18. In detail, the RDL structure 50 is electrically connected to the pads 22 of the die 28 through the pads 11 of the wafer 18 and the bonding structure 30.

A plurality of connectors 51 are formed on the redistribution layer RDL3 of the RDL structure 50. In some embodiments, the connectors 51 are referred as conductive terminals. The connectors 51 are electrically connected to the die 28 through the RDL structure 50, the pads 11 and the bonding structure 30. The materials, forming methods, and the structure of the RDL structure 50 and the connectors 51 are substantially the same as or different from those described in the first embodiment, and is not described again.

Referring to FIG. 5N, a package structure (3DIC structure) 100c is thus completed. The 3DIC structure 100c includes the die 28, the carrier 49, the bonding film 48, the dielectric structure 45, the plurality of pads 11 of the wafer 18, the RDL structure 50, and the plurality of connectors 51. The die 28 is bonded to the pads 11 through a bonding structure 30, such as a hybrid bonding structure. The dielectric structure 45 covers the sidewalls and the bottom surface (that is, back surface) of the die 28. The carrier 49 is bonded to the dielectric structure 45 though a bonding film 48. The connectors 51 are electrically connected to the die 28 through the RDL structure 50, the pads 11 and the bonding structure 30. In some embodiments, the bonding film 48 is not in contact with the die 28, and is separated from the die 28 by the dielectric structure 45 therebetween. In some embodiments, the RDL structure 50 is not in contact with the die 28 and the dielectric structure 45, and is physically separated from the die 28 and the dielectric structure 45 by the bonding structure 15, the pads 11 and the dielectric layer 12 of the wafer 18 therebetween.

In some other embodiments, the RDL structure 50 may be not formed, and the connectors 51 may be in electrical contact with the pads 11 of the wafer 18.

Figure 6:
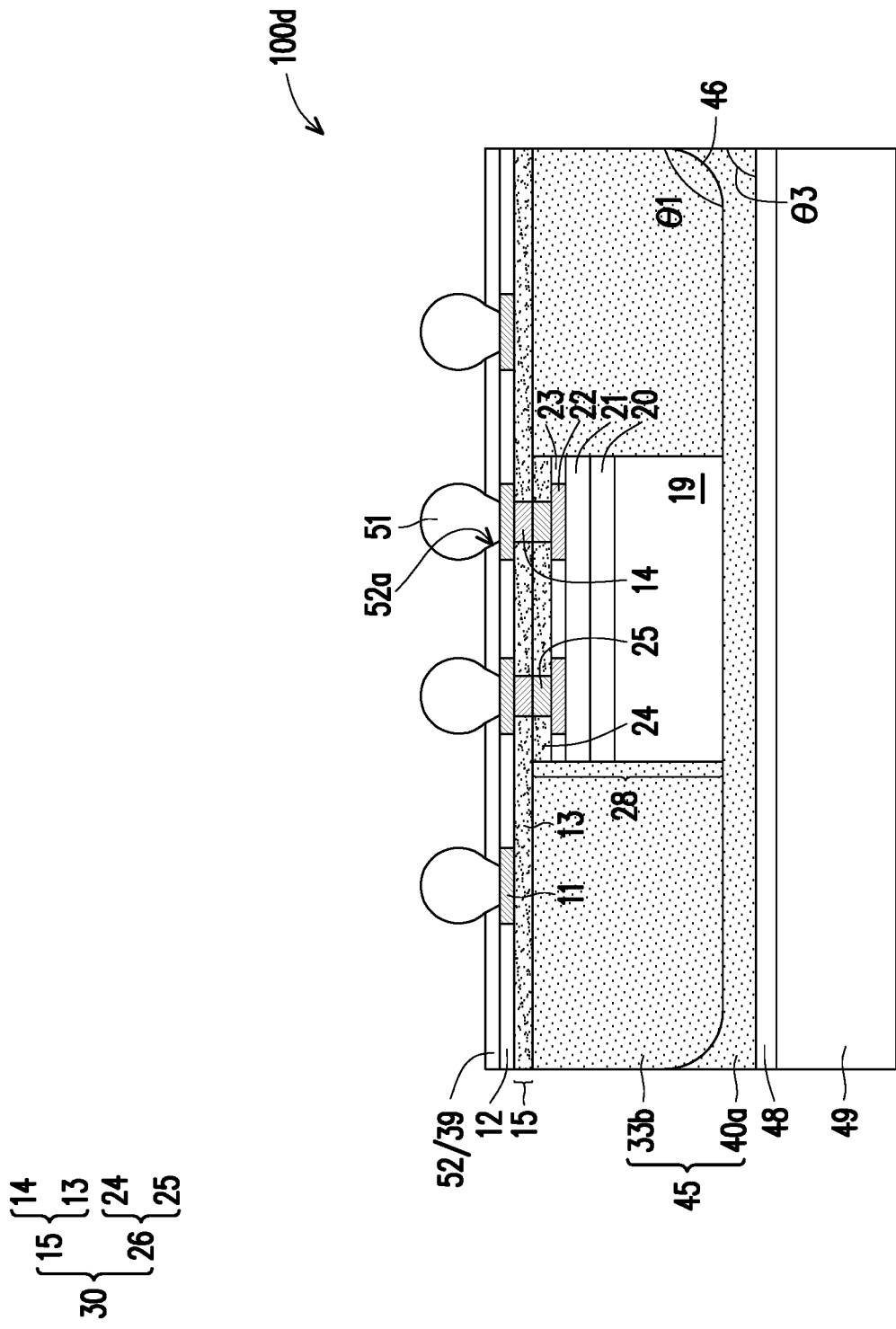
FIG. 6 and FIG. 7 are schematic cross-sectional view illustrating a 3DIC structure according to some embodiments of the disclosure.

Referring to FIG. 5M and FIG. 6, in some embodiments, after a portion of the wafer 18 is removed, a protection layer 52 is formed on the dielectric layer 12 and pads 11 of the wafer 18. The protection layer 52 may be a dielectric layer, a polymer layer or a combination thereof. The material and the forming method of the protection layer 52 may be the same as or different from those of the dielectric layer 12 or the polymer layer PM1, PM2, or PM3. The protection layer 52 has a plurality of openings 52a exposing portions of the top surfaces of the pads 11. The openings 52a may be formed by photolithograph and etching processes. Thereafter, the connectors 51 are formed on and electrically connected to the pads 11 exposed by the openings of the protection layer 52.

In some other embodiments, the stop layer 39 is not removed when removing portions of the wafer 18, and remained to serve as the protection layer 52.

Referring to FIG. 6, a 3DIC structure 100d is thus completed, the 3DIC structure 100d includes the die 28, the carrier 49, the bonding film 48, the dielectric structure 45, the plurality of pads 11 of the wafer 18, and the plurality of connectors 51. Except the 3DIC structure 100d does not include a RDL structure, the other structure features of the 3DIC structure 100d are substantially the same as those of the 3DIC structure 100c.

Figure 7:
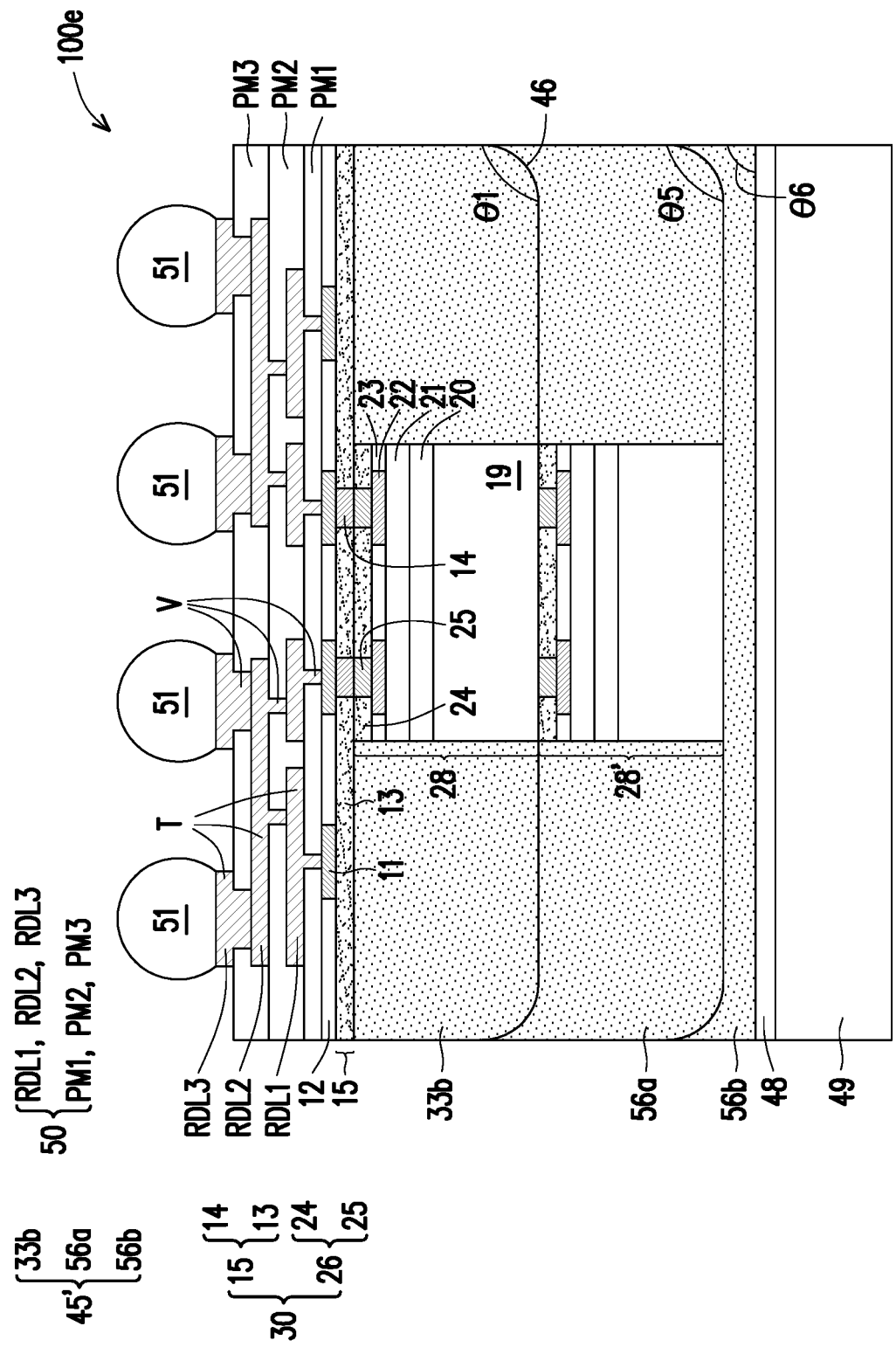

FIG. 7 is a cross-sectional view illustrating an example of two dies stacked on a wafer according to some embodiments of the disclosure.

Referring to FIG. 7, in some embodiments, a 3DIC structure 100e includes two dies 28 and 28', the carrier 49, the bonding film 48, a dielectric structure 45', the plurality of pads 11 of the wafer 18, the RDL structure 50, and the plurality of connectors 51. In some embodiments, after the dielectric layer 33b is formed (as shown in FIG. 5E), the die 28' is bonded to the die 28 through a bonding process, such as a hybrid bonding process, a fusion bonding process, or a combination thereof. Thereafter, processes similar to those described from FIG. 5C to FIG. 5J are performed to form the dielectric structure 45'.

Still referring to FIG. 7, the dielectric structure 45' covers the sidewalls of the dies 28 and 28' and the bottom surface of the die 28'. The dielectric structure 45' is a multi-layer structure. In some embodiments, the dielectric structure 45' includes the dielectric layer 33b, a dielectric layer 56a and a dielectric layer 56b. In some embodiments, the corners θ1 and θ5 of the dielectric layer 33b and the dielectric layer 56a are rounding, while the corner θ6 of the dielectric layer 56b is a right angle or slightly rounded. The structural feature of the corner of the dielectric layer 56b is substantially the same as or different from those of the second dielectric layer 40a as described in FIG. 5J. The other structural features of the 3DIC structure 100e may be the same as or different from those of the 3DIC structure 100c. It is noted that, in 3DIC structure 100e, the RDL structure 50 may also be omitted like the 3DIC structure 100d as shown in FIG. 6.

In the foregoing embodiments, the die is bonded to the wafer through a hybrid bonding process, but the disclosure is not limited thereto. In some other embodiments, the die may be bonded to the wafer through a fusion bonding process.

Figure 8A:
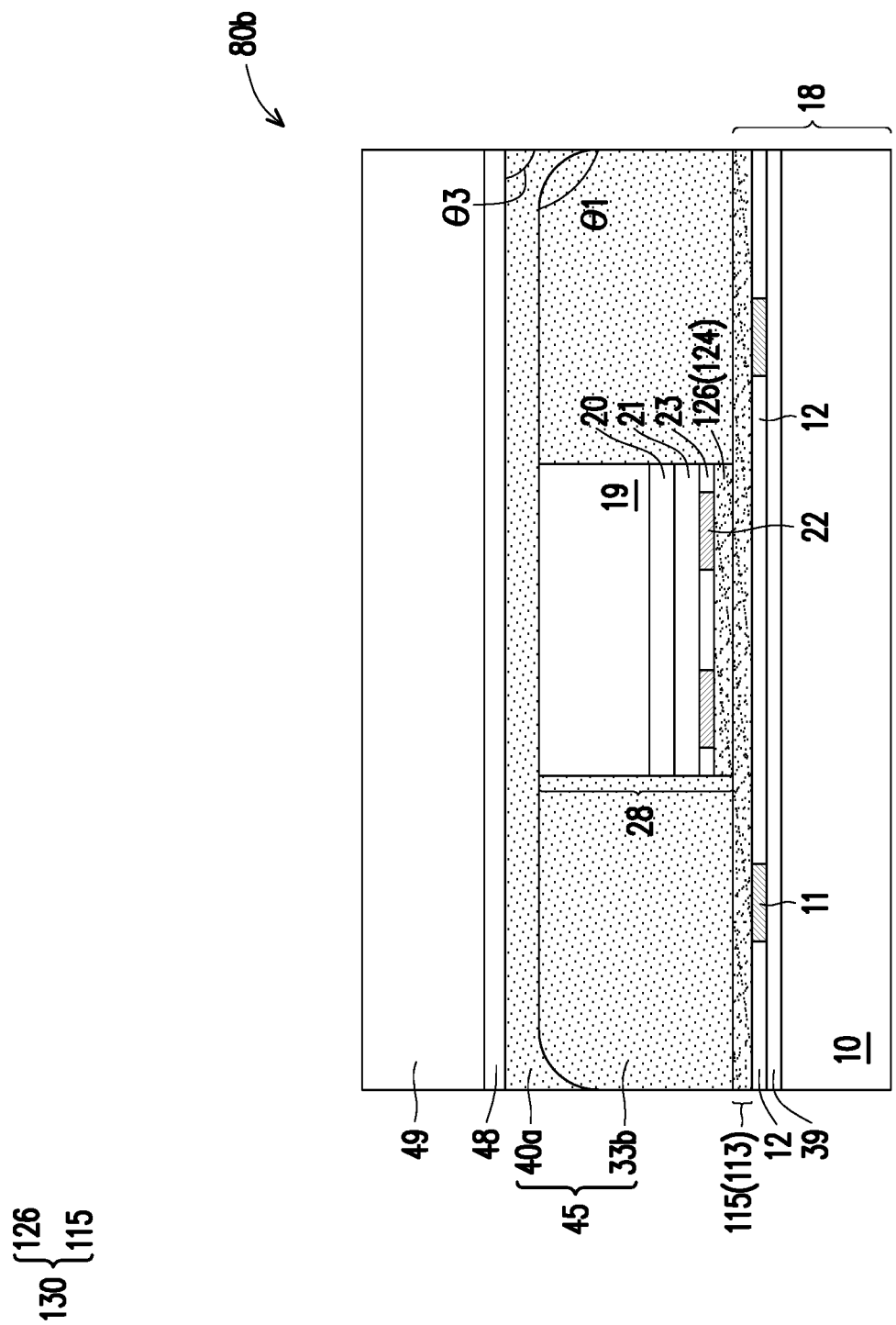

Referring to FIG. 8A, a 3DIC structure 80b similar to the 3DIC structure 80a (FIG. 5L) is formed, the difference lies in that the die 28 is bonded to the wafer 18 through a fusion bonding process. In some embodiments, a bonding structure 115 of the wafer 18 and a bonding structure 126 of the die 28 include dielectric materials and do not include conductive materials. The bonding structure 115 includes a dielectric layer 113. The bonding structure 126 includes a dielectric layer 124. The materials of the dielectric layer 113 and the dielectric layer 124 are substantially the same as or different from those of the dielectric layer 13 and the dielectric layer 24 described in the foregoing embodiments. The bonding structure 115 and the bonding structure 126 differs from the bonding structure 15 and the bonding structure 26 in that no conductive feature is formed in the dielectric layer 113 or in the dielectric layer 124, respectively. The bonding structure 126 and the bonding structure 115 are bonded through a fusion bonding process, and together form a bonding structure 130 which is a fusion bonding structure.

Expect the die 28 and the wafer 18 are bonded through a different method, the other forming method and structural features of the 3DIC structure 80b are substantially the same as or different from those of the 3DIC structure 80a (FIG. 5L).

Referring to FIG. 8B, in some embodiments, the 3DIC structure 80b is turned over, the wafer 18 is removed. In some embodiments, the wafer 18 is completely removed, and the top surfaces of the dielectric structure 45 and the die 28 are exposed.

Figure 8C:
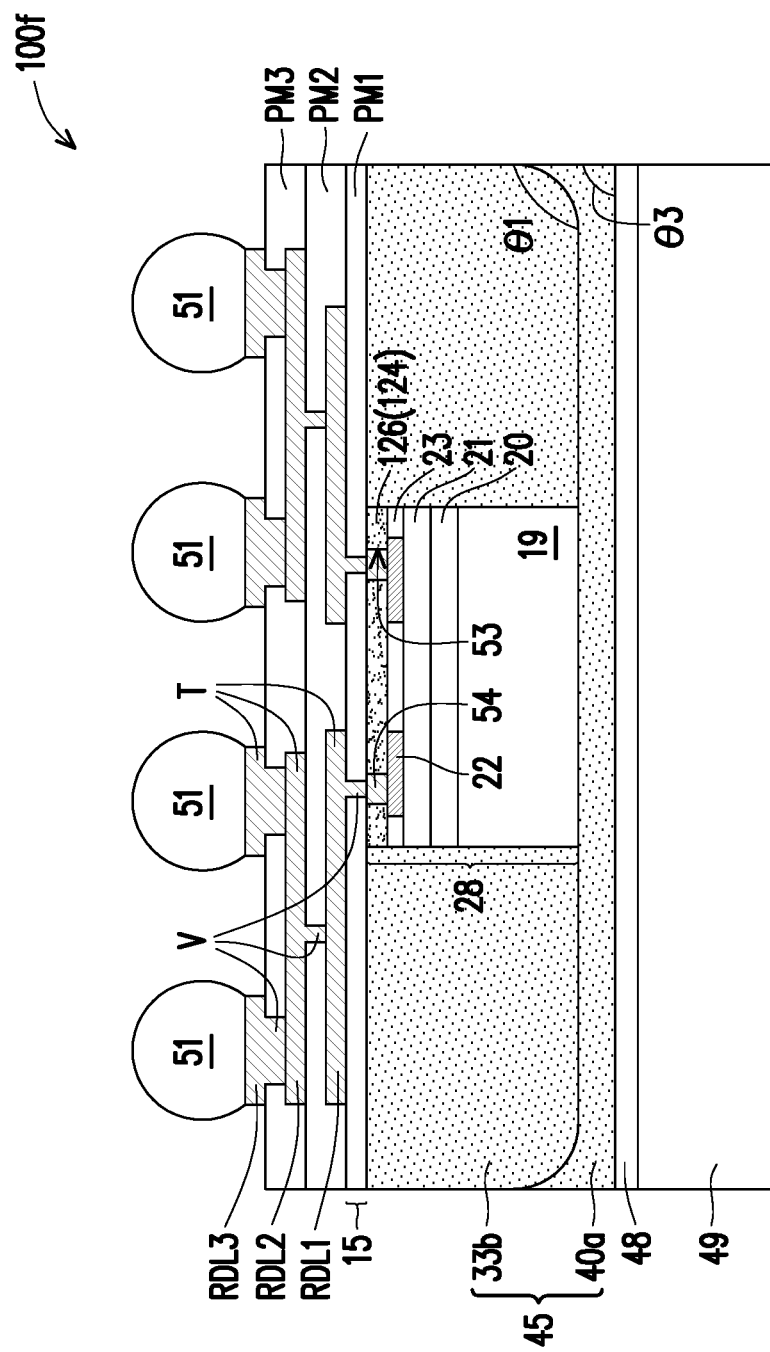

Referring to FIG. 8B and FIG. 8C, the bonding structure 126 is patterned to form a plurality of openings 53 exposing the top surface of the pads 22 of the die 28. A plurality of connectors 54 are formed in the openings 53 of the bonding structure 126 to be in electrical contact with the pads 22 of the die 28. Thereafter, a RDL structure 50 including polymer layers PM1, PM2, PM3 and redistribution layers RDL1, RDL2, RDL3 is formed on the dielectric structure 45 and the die 28. The RDL structure 50 is electrically connected to the pads 22 of the die 28 through the connectors 54. A plurality of connectors 51 are formed on the RDL structure 50 and electrically connected to the die 28 through the RDL structure 50.

Referring to FIG. 8C, a 3DIC structure 100f is thus completed, the 3DIC structure 100f is similar to the 3DIC structure 100c, the difference lies in that the 3DIC structure 100f does not include the wafer 18, and the RDL structure 50 is in electrical contact with the connector 54 formed in the bonding structure 126 of the die 28. The RDL structure 50 is in contact with the die 28 and the dielectric structure 45. The other structural features of the 3DIC structure 100f may be substantially the same as or different from those of the 3DIC structure 100c, and are not described again.

Figure 9:
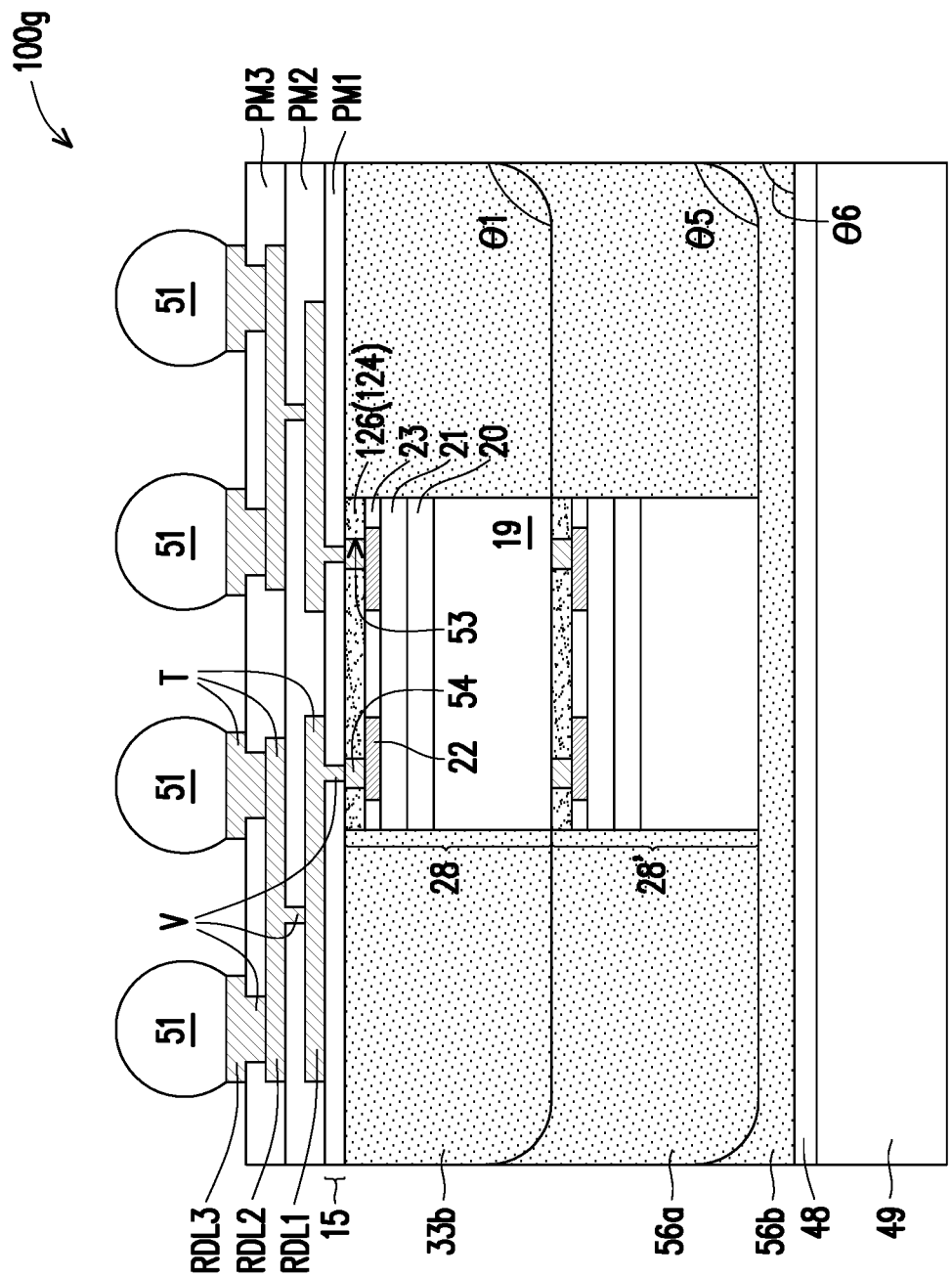
FIG. 9 and FIG. 10 are schematic cross-sectional view illustrating a 3DIC structure according to some embodiments of the disclosure.

In some embodiments, the 3DIC structure 100f may include two dies stacked vertically. Referring to FIG. 9, a 3DIC structure 100g may be formed. The 3DIC structure 100g is similar to the 3DIC structure 100f except that the 3DIC structure 100g includes two dies 28 and 28' stacked vertically.

Figure 10:
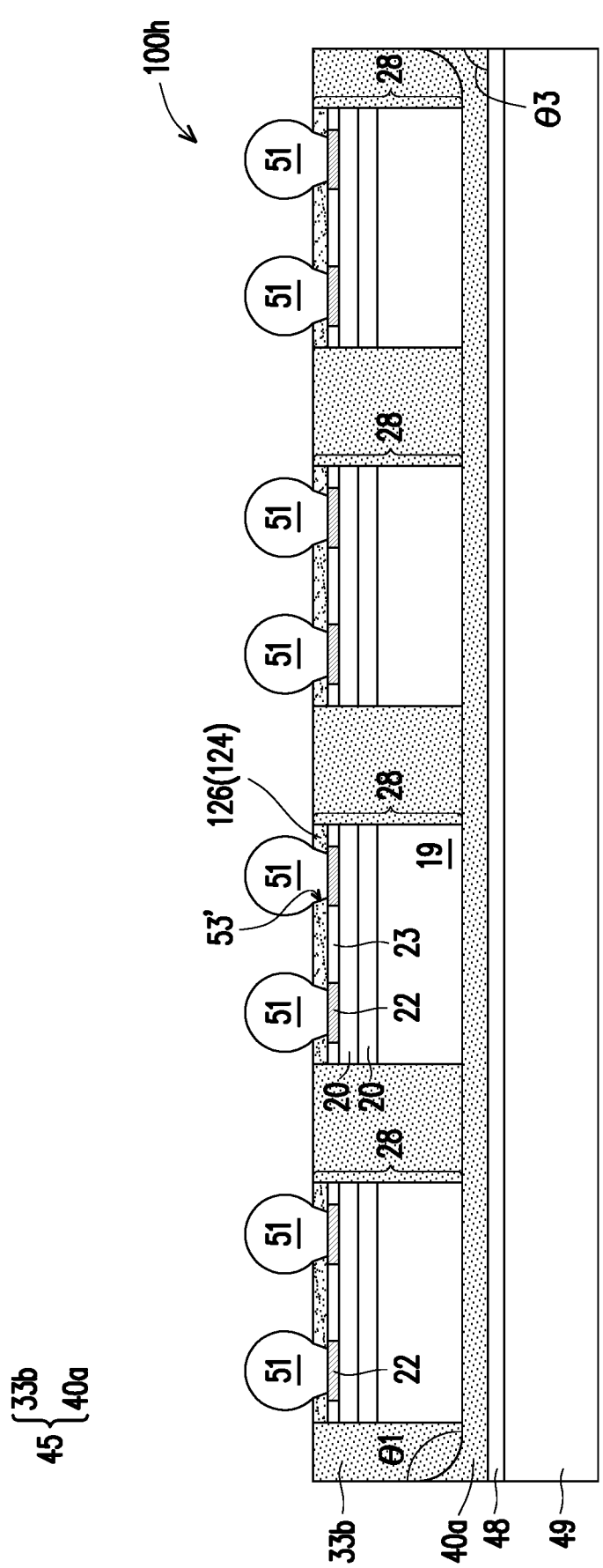

In some embodiments, the RDL structure 50 included in the 3DIC structure 100f or 100g may be omitted, and a plurality of dies 28 side by side may be includes in the 3DIC structure. Referring to FIG. 8B and FIG. 10, in some embodiments, after the wafer 18 is removed from the 3DIC structure 80b, a plurality of openings 53' are formed in the bonding structure 126. The openings 53' expose portions of top surfaces of the pads 11 of the dies 28. Thereafter, the connectors 51 are formed on and electrically connected to the pads exposed by the openings 53', and a 3DIC structure 100h is thus completed. The 3DIC structure 100h includes a plurality of dies 28 side by side. The connectors 51 are in contact with the die 28 and the dielectric structure 45. In some embodiments, the connectors 51 are in contact with the pads 22 of the die 28, but the disclosure is not limited thereto. In some other embodiments, other conductive features may be included between the pads 22 and the connectors 51.

In the embodiments of the disclosure, during the planarization process of planarizing the top surfaces of the die and the dielectric layer aside the die, the corner of the die is protected and covered by the dielectric material layer, therefore, the corner rounding issue of the die edge is avoided or reduced. On the other hand, before forming the bonding film, the dielectric structure is formed of two dielectric layers and planarized by an etching process and a planarization process, as protrusions are formed on wafer edge by the etching process before the planarization process is performed, the rounding issue may occur to the dielectric structure on wafer edge is thus avoided or reduced. Therefore, the bonding film on the dielectric structure has a flat surface, and better adhesion or bonding between the bonding film and the carrier or wafer is achieved.

In accordance with some embodiments of the disclosure, a method of manufacturing a 3DIC structure includes the following processes. A die is bonded to a wafer. A first dielectric layer is formed on the wafer and laterally aside the die. A second dielectric material layer is formed on the die and the first dielectric layer. A portion of the second dielectric material layer over a non-edge region of the wafer is selectively removed to form a protruding portion over an edge region of the wafer. The second dielectric material layer is planarized to form a second dielectric layer on the first dielectric layer and the die. A bonding film is formed on the second dielectric layer. A carrier is bonded to the wafer through the bonding film.

In accordance with alternative embodiments of the disclosure, a method of manufacturing a 3DIC structure comprises the following processes. A die is bonded to a wafer. A first dielectric material layer is formed on the wafer and the die. A portion of the first dielectric material layer on the die is selectively removed. The first dielectric material layer and the die are planarized, so as to form a first dielectric layer laterally aide the die, wherein the first dielectric layer comprises a rounding coner. A second dielectric layer is formed on the first dielectric layer and the die. A portion of the second dielectric layer covering the rounding corner of the first dielectric layer is thicker than a second portion of the second dielectric layer covering the die. A carrier is bonded to the second dielectric layer through a bonding film.

In accordance with alternative embodiments of the disclosure, a method of manufacturing a 3DIC structure includes the following processes. A die is bonded to a wafer. A first dielectric material layer is formed on the wafer and the die. A portion of the first dielectric material on the die is selectively removed, so as to form a protrusion covering an edge of the die. The first dielectric material layer and the die are planarized, so as to form a first dielectric layer laterally aside the die. The first dielectric layer has a first rounding corner over an edge of the wafer. A second dielectric material layer is formed on the die and the first dielectric layer. The second dielectric material layer has a second rounding corner over the first rounding corner, and the second dielectric material layer is formed to have a thickness larger than a height of the second rounding corner. A portion of the second dielectric material layer is selectively removed to form a protruding portion covering the first rounding corner of the first dielectric layer. The second dielectric material layer is planarized to form a second dielectric layer on the first dielectric layer and the die. A bonding film is formed on the second dielectric layer. A carrier is bonded to the second dielectric layer through the bonding film.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing a 3DIC structure, comprising:
   bonding a die to a wafer;
   forming a first dielectric layer on the wafer and laterally aside the die;
   forming a second dielectric material layer on the die and the first dielectric layer;
   selectively removing a portion of the second dielectric material layer over a non-edge region of the wafer to form a protruding portion over an edge region of the wafer; and
   planarizing the second dielectric material layer to form a second dielectric layer on the first dielectric layer and the die;
   wherein a first corner of the first dielectric layer comprises a first rounding portion, a second corner of the second dielectric layer comprises a second rounding portion; and
   a width of the second rounding portion is less than a width of the first rounding portion, a height of the second rounding portion is less than a height of the first rounding portion.

2. The method of claim 1, where the selectively removing the portion of the second dielectric material layer comprises:
   forming a mask layer on the second dielectric material layer;
   pattering the mask layer to form a patterned mask layer having an opening, wherein the patterned mask layer covers the second dielectric material layer on the edge region of the wafer, and the opening exposes the portion of the second dielectric material layer over the non-edge region of the wafer;
   etching the portion of the second dielectric material layer exposed by the opening, wherein the second dielectric material layer covered by the patterned mask layer form the protruding portion; and
   removing the patterned mask layer.

3. The method of claim 1, wherein the planarizing the second dielectric material layer comprises a chemical mechanical polishing (CMP) process, and the protruding portion is removed by the CMP process.

4. The method of claim 1, further comprising:
   removing at least a substrate of the wafer; and
   forming a conductive terminal to electrically connected to the die.

5. The method of claim 1, wherein a thickness of the second dielectric layer on the first corner of the first dielectric layer is larger than a thickness of the second dielectric layer on the die.

6. The method of claim 1, wherein a length of the second rounding portion is less than a length of the first rounding portion.

7. The method of claim 1, wherein a first corner of the first the width and the height of the second rounding portion are zero, and the second corner of the second dielectric layer is a right angle.

8. A method of manufacturing a 3DIC structure, comprising:
   bonding a die to a wafer;
   forming a first dielectric material layer on the wafer and the die;
   selectively removing a portion of the first dielectric material layer on the die;
   planarizing the first dielectric material layer and the die, so as to form a first dielectric layer laterally aide the die, wherein the first dielectric layer comprises a rounding corner;
   forming a second dielectric layer on the first dielectric layer and the die, wherein a first portion of the second dielectric layer covering the rounding corner of the first dielectric layer is thicker than a second portion of the second dielectric layer covering the die; and
   bonding a carrier to the second dielectric layer through a bonding film.

9. The method of claim 8, wherein after the selectively removing the portion of the first dielectric material layer on the die, a corner of the die is still covered by the first dielectric material layer.

10. The method of claim 8, wherein the selectively removing the portion of the first dielectric material layer comprises:
    forming a patterned mask layer on the first dielectric material layer, wherein the patterned mask layer covers the first dielectric material layer on a corner of the die, and exposes the portion of the first dielectric material layer on the die;
    performing an etching process on the portion of the first dielectric material layer exposed by the patterned mask layer, so as to form a recess in the first dielectric material layer and form a protrusion on the corner of the die; and
    removing the patterned mask layer.

11. The method of claim 10, wherein the performing the etching process is stopped until or before a top surface of the die is exposed.

12. The method of claim 10, wherein the die comprises a plurality of dies, and the protrusion is located on corners of the plurality of dies, the recess is overlapped with the plurality of dies.

13. The method of claim 8, wherein after bonding the carrier to the second dielectric layer, further comprises:
    removing at least a portion of the wafer; and
    forming a conductive terminal over and electrically connected to the die and/or the wafer.

14. The method of claim 13, further comprising forming a redistribution layer (RDL) structure to connect to the die and/or the wafer before forming the conductive terminal, and the conductive terminal is electrically connected to the die and/or the wafer through the RDL structure.

15. The method of claim 8, wherein a ratio of a contact area between the bonding film and the carrier to an area of the carrier facing the bonding film ranges from 0.99 to 1.

16. The method of claim 8, wherein a width of the rounding corner of the first dielectric material layer ranges from 0 to 0.4 µm.

17. A method of manufacturing a package structure, comprising:
    bonding a die to a wafer;

forming a first dielectric material layer on the wafer and the die;

selectively removing a portion of the first dielectric material layer on the die, so as to form a protrusion covering an edge of the die;

planarizing the first dielectric material layer and the die, so as to form a first dielectric layer laterally aside the die, wherein the first dielectric layer has a first rounding corner over an edge of the wafer;

forming a second dielectric material layer on the die and the first dielectric layer, wherein the second dielectric material layer has a second rounding corner over the first rounding corner, and the second dielectric material layer is formed to have a thickness larger than a height of the second rounding corner;

selectively removing a portion of the second dielectric material layer to form a protruding portion covering the first rounding corner of the first dielectric layer; and planarizing the second dielectric material layer to form a second dielectric layer on the first dielectric layer and the die.

18. The method of claim 17, wherein the second rounding corner of the second dielectric material layer is completely removed during the step of planarizing the second dielectric material layer, and a corner of the second dielectric layer is fonned to be a right angle.

19. The method of claim 17, wherein the second rounding corner of the second dielectric material layer is partially removed during the step of planarizing the second dielectric material layer, and a corner of the second dielectric layer is formed to have a rounding portion, wherein a length of a surface of the rounding portion is less than a length of a surface of the first rounding corner.

20. The method of claim 17, wherein the second dielectric layer comprises a portion disposed laterally aside the first dielectric layer and the die.

* * * * *